(12) United States Patent
Tseng et al.

(10) Patent No.: US 12,349,599 B2
(45) Date of Patent: Jul. 1, 2025

(54) MEMORY DEVICE HAVING RESISTANCE SWITCHING LAYER AND INTEGRATED CIRCUIT DEVICE HAVING RESISTANCE SWITCHING LAYER

(71) Applicant: TAIWAN SEMICONDUCTOR MANUFACTURING CO., LTD., Hsinchu (TW)

(72) Inventors: Hsin-Hsiang Tseng, Changhua County (TW); Chih-Lin Wang, Hsinchu County (TW); Yi-Huang Wu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/608,365

(22) Filed: Mar. 18, 2024

(65) Prior Publication Data
US 2024/0237545 A1   Jul. 11, 2024

Related U.S. Application Data

(60) Continuation of application No. 17/839,326, filed on Jun. 13, 2022, now Pat. No. 11,963,460, which is a division of application No. 16/721,789, filed on Dec. 19, 2019, now Pat. No. 11,362,267.

(51) Int. Cl.
*H10N 50/10* (2023.01)
*H10N 50/01* (2023.01)
*H10N 50/80* (2023.01)

(52) U.S. Cl.
CPC ............ *H10N 50/10* (2023.02); *H10N 50/01* (2023.02); *H10N 50/80* (2023.02)

(58) Field of Classification Search
CPC ......... H10N 50/10; H10N 50/80; H10N 50/01
USPC ........................................ 257/421
See application file for complete search history.

(56) References Cited

U.S. PATENT DOCUMENTS

| | | | | |
|---|---|---|---|---|
| 7,615,439 B1* | 11/2009 | Schricker | ............ | H10N 70/231 438/237 |
| 9,887,238 B1* | 2/2018 | He | ............ | H01L 29/4908 |
| 2010/0155685 A1* | 6/2010 | Hurkx | ............ | H10N 70/8825 257/3 |
| 2011/0272664 A1* | 11/2011 | Tada | ............ | H10N 70/826 257/4 |
| 2011/0310656 A1* | 12/2011 | Kreupl | ............ | H10N 70/8833 257/E45.001 |
| 2012/0211715 A1* | 8/2012 | Asano | ............ | H10N 70/826 257/1 |
| 2015/0016174 A1* | 1/2015 | Liu | ............ | H01L 23/5252 365/96 |
| 2016/0204344 A1* | 7/2016 | Hsieh | ............ | H10N 70/8833 257/4 |
| 2020/0395409 A1* | 12/2020 | Song | ............ | H10N 70/882 |
| 2021/0167128 A1* | 6/2021 | Ando | ............ | H10B 63/845 |
| 2021/0290590 A1* | 9/2021 | Anderson | ............ | A61P 31/18 |

(Continued)

*Primary Examiner* — Jami Valentine Miller
(74) *Attorney, Agent, or Firm* — Maschoff Brennan

(57) ABSTRACT

A memory device includes a bottom electrode, a resistance switching element over the bottom electrode, a top electrode over the resistance switching element, and a dielectric layer. The dielectric layer surrounds the bottom electrode, the resistance switching element, and the top electrode. The resistance switching element has a first portion between the top electrode and the dielectric layer.

20 Claims, 28 Drawing Sheets

(56) References Cited

U.S. PATENT DOCUMENTS

| | | | |
|---|---|---|---|
| 2021/0312990 A1* | 10/2021 | Hsu | G06F 1/32 |
| 2022/0005868 A1* | 1/2022 | Hsu | H10N 70/826 |

* cited by examiner

MEMORY DEVICE HAVING RESISTANCE SWITCHING LAYER AND INTEGRATED CIRCUIT DEVICE HAVING RESISTANCE SWITCHING LAYER

PRIORITY CLAIM AND CROSS-REFERENCE

This application is a continuation of U.S. patent application Ser. No. 17/839,326, filed Jun. 13, 2022, which is a divisional application of U.S. patent application Ser. No. 16/721,789, filed Dec. 19, 2019, now U.S. Pat. No. 11,362,267, issued on Jun. 14, 2022, the entirety of which is incorporated by reference herein in its entirety.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
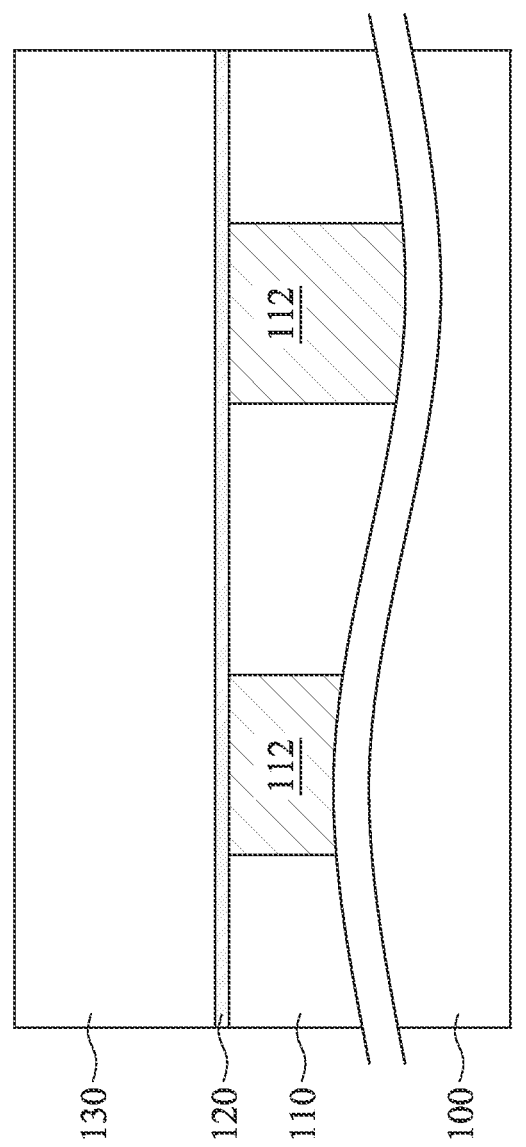
FIGS. 1-11B illustrates a memory device at various intermediate stages of manufacture according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments of this disclosure, a magnetoresistive random access memory (MRAM) device is formed. The MRAM device includes a magnetic tunnel junction (MTJ) stack. The resistance switching element includes a tunnel barrier layer formed between a ferromagnetic pinned layer and a ferromagnetic free layer. The tunnel barrier layer is thin enough (such a few nanometers) to permit electrons to tunnel from one ferromagnetic layer to the other. A resistance of the resistance switching element is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the resistance switching element is in a lower resistive state, corresponding to a digital signal "0". When the magnetic moment of the ferromagnetic free layer is anti-parallel to that of the ferromagnetic pinned layer, the resistance of the resistance switching element is in a higher resistive state, corresponding to a digital signal "1". The resistance switching element is coupled between top and bottom electrode and an electric current flowing through the resistance switching element (tunneling through the tunnel barrier layer) from one electrode to the other is detected to determine the resistance and the digital signal state of the resistance switching element.

According to some embodiments of this disclosure, the MRAM device is formed within a chip region of a substrate. A plurality of semiconductor chip regions is marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIGS. 1-11B illustrates a memory device at various intermediate stages of manufacture according to various embodiments of the present disclosure. FIG. 1 illustrates a wafer having a substrate 100 thereon. The substrate 100 includes an interlayer dielectric (ILD) layer or inter-metal dielectric (IMD) layer 110 with metallization pattern 112. The ILD layer 110 may be an extra low-k dielectric (ELK) layer, such as carbon-doped silicon oxide, may be an oxide, such as silicon oxide, and/or may be the like or a combination thereof. In some embodiments, the ILD layer 110 may be formed of a low-k dielectric material having a k value less than about 3.9. The k value of the ILD layer 110 may even be lower than about 2.8. The metallization pattern 112 may be electrode vias, including conductive materials, such as copper, aluminum, the like, and/or a combination thereof. The metallization pattern 112 may be formed by etching openings in the ILD layer 110, filling the openings in the ILD layer 110 with the conductive materials, and removing an excess portion of the conductive materials out of the openings, for example, by a chemical mechanical polish (CMP) process. The substrate 100 may also include active and passive devices, for example, underlying the ILD layer 110. These further components are omitted from the figures for clarity, and how these components are formed will be readily apparent to a person having ordinary skill in the art.

A first spacer layer 120 is blanket formed over the ILD layer 110 and the metallization pattern 112. The first spacer layer 120 may include suitable dielectric materials different from a material of the ILD layer 110. For example, the first spacer layer 120 may include aluminum nitride, aluminum oxide, silicon nitride, silicon carbide, carbon-doped silicon nitride, silicon oxide, carbon-doped silicon oxide, silicon oxynitride, and combinations thereof. In some embodiments, the first spacer layer 120 may also be a composite layer including two or more layers made of different materials, such as a silicon nitride/silicon carbide stack. The first spacer layer 120 may be formed using CVD, PVD, ALD, the like, and/or combinations thereof.

An interlayer dielectric (ILD) layer 130 is formed on the first spacer layer 120. The ILD layer 130 may include suitable dielectric materials different from a material of the first spacer layer 120. For example, the ILD layer 130 may be an extra low-k dielectric (ELK) layer, such as carbon-doped silicon oxide, may be an oxide, such as silicon oxide, and/or may be the like or a combination thereof. In some embodiments, the ILD layer 170 may be formed of a low-k dielectric material having a k value less than about 3.9. The k value of the ILD layer 130 may even be lower than about 2.8. The ILD layer 130 may have the same material as the underlying ILD layer 110.

Figure 2:
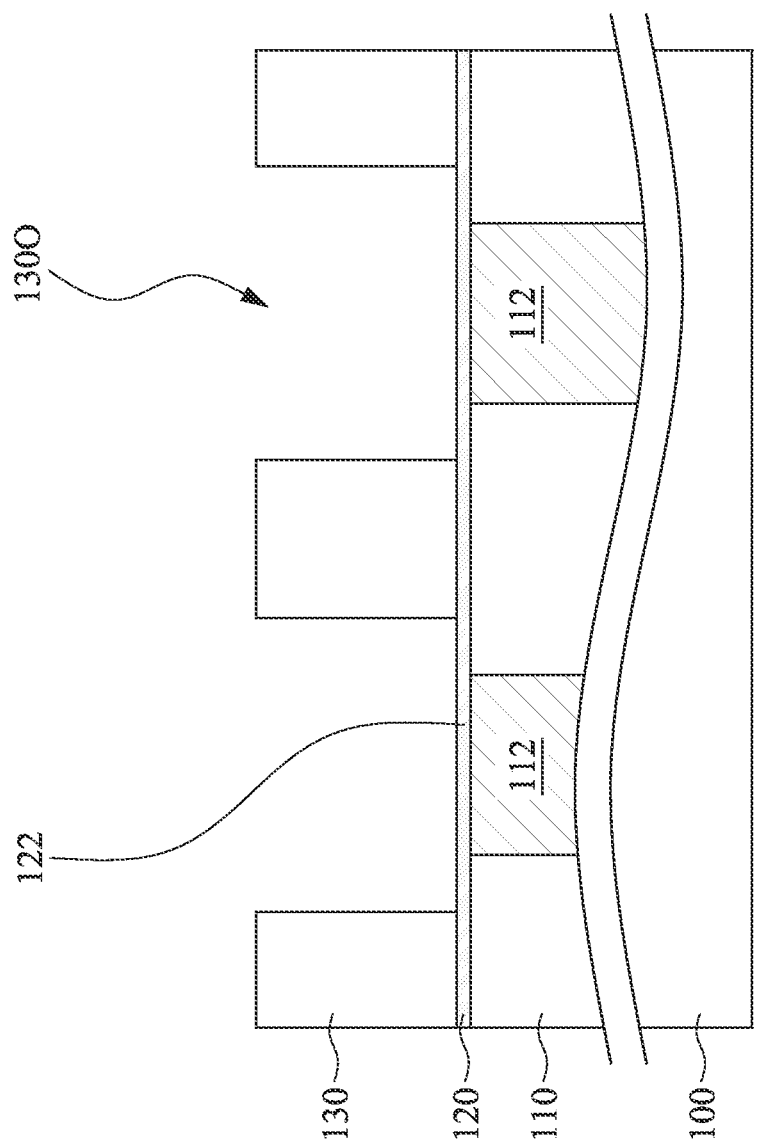

Reference is made to FIG. 2. The ILD layer 130 is patterned to form one or more opening 130O therein. For example, a photoresist is formed on the ILD layer 130, and a photolithography process to be performed to pattern the photoresist. Then, the opening 130O are etched in the ILD layer 130 using the patterned photoresist as an etch mask, so as to expose portions 122 of the first spacer layer 120 over the metallization pattern 112. To be specific, a portion of the ILD layer 130 over the metallization pattern 112 is removed until the portion 122 of the first spacer layer 120 is exposed. In some embodiments, the first spacer layer 120 has higher etch resistance to an etchant used in the removing the portion of the ILD layer 130 (or the etching the openings 130O) than that of the ILD layer 130, such that the first spacer layer 120 may protect the underlying metallization pattern 112 and the ILD layer 110 from being damaged when etching the openings 130O. In some embodiments where the ILD layer 130 is silicon oxide, the etchant used in etching the openings 130O can be dilute hydrofluoric acid (HF), HF vapor, $CF_4$, $C_4F_8$, $CH_xF_y$, $C_xF_y$, $SF_6$, or $NF_3$ gas. For example, in an etching process using dilute HF, HF vapor, $CF_4$, $C_4F_8$, $CH_xF_y$, $C_xF_y$, $SF_6$, or $NF_3$ gas as an etchant, an etch rate of the first spacer layer 120 is slower than that of the ILD layer 130. After the etching process, the patterned photoresist over the ILD layer 130 can be removed using, for example, an ashing process.

The openings 130O are formed for accommodating memory structure that subsequently formed. In some embodiments, a width of the opening 130O may be in a range of about 100 angstroms to about 2000 angstroms. If the width of the opening 130O is less than 100 angstroms, films of the memory structure to be formed may not be well deposited into the opening 130O, which would result in undesired profile of the memory structure to be formed. If the width of the opening 130O is greater than 2000 angstroms, the size of the memory structure may be too large, which would result in low density of memory device. In some embodiments, a depth of the opening 130O may be in a range of about 100 angstroms to about 2000 angstroms. If the depth of the opening 130O is less than 100 angstroms, the openings 130O may not accommodate the films of the memory structure to be formed. If the depth of the opening 130O is greater than 2000 angstroms, films of the memory structure to be formed may not be well deposited into the opening 130O, which would result in undesired profile of the memory structure to be formed. In some embodiments, the distance between two adjacent openings 130O is greater than 100 angstroms, such that the memory stacks formed in the openings 130O later may be well electrically isolated from each other.

Figure 3:
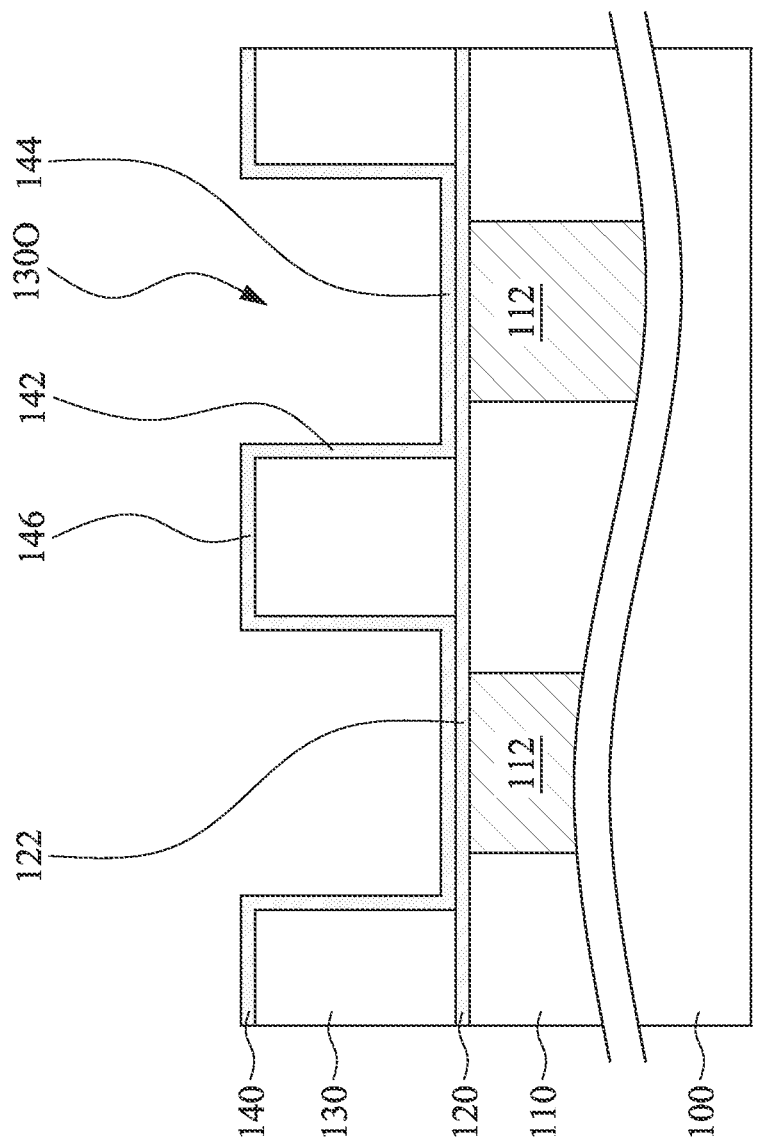

Reference is made to FIG. 3. A second spacer layer 140 is blanket formed over the first spacer layer 120 and the ILD layer 130. The second spacer layer 140 may include portions 142 and 144 in the openings 130O and a portion 146 outside the openings 130O. The portions 142 extends along sidewalls of the openings 130O of the ILD layer 130, the portions 144 extends along top surfaces of the portions 122 of the first spacer layer 120, and the portion 146 extends along a top surface of the ILD layer 130. The second spacer layer 140 may include suitable dielectric materials different from a material of the ILD layer 130. For example, the second spacer layer 140 may include aluminum nitride, aluminum oxide, silicon nitride, silicon carbide, carbon-doped silicon nitride, silicon oxide, carbon-doped silicon oxide, silicon oxynitride, and combinations thereof. In some embodiments, the second spacer layer 140 may also be a composite layer including two or more layers made of different materials, such as a silicon nitride/silicon carbide stack. The second spacer layer 140 may be formed using CVD, PVD, ALD, the like, and/or combinations thereof. The material of the second spacer layer 140 may be the same as or different from that of the first spacer layer 120.

Figure 4:
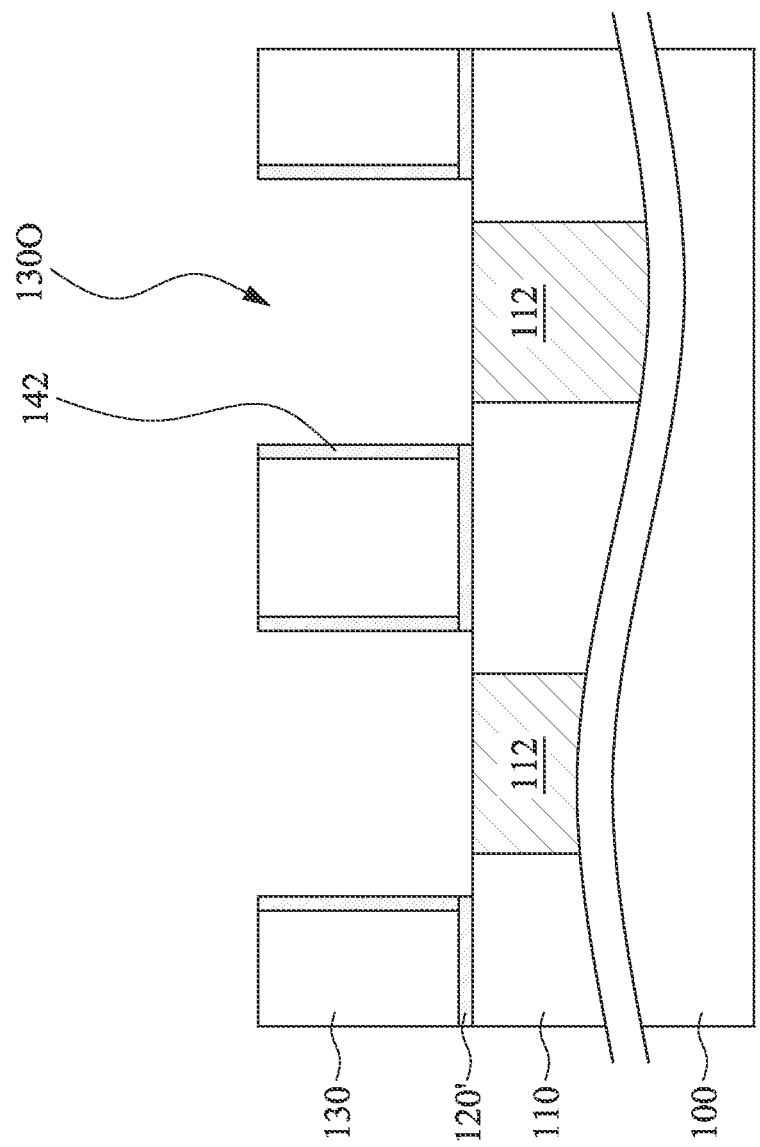

Reference is made to FIG. 4. The spacer layers 120 and 140 (referring to FIG. 2) are patterned by suitable anisotropic etching process, such as dry etching process. The anisotropic etching process may remove horizontal portions 144 and 146 of the second spacer layer 140 (referring to FIG. 2) and the portions 122 of the first spacer layer 120 (referring to FIG. 2), and remain vertical portions 142 of the second spacer layer 140 on sidewalls of the openings 130O of the ILD layer 130. The remaining portions 142 of the second spacer layer 140 (referring to FIG. 2) can be referred to as spacers 142 hereinafter. The remaining portions of the second spacer layer 120 (referring to FIG. 2) can be referred to as spacer layer 120'. For example, in some embodiments where the first and second spacer layers 120 and 140 are silicon nitride, the patterning of the silicon nitride layers includes a dry etching using $CH_2F_2$ as an etchant, although other applicable etchants may be used. In some embodiments, the ILD layer 130 may a higher etch resistance to the etchants than that of the spacer layers 120 and 140 (referring to FIG. 2), such that the ILD layer 130 remains intact after patterning the spacer layers 120 and 140 (referring to FIG. 2). For example, in an etching process using $CH_2F_2$, $CH_2F_4$, $CH_xF_y$, $SF_6$, or $C_xF_y$, as an etchant, an etch rate of the ILD layer 130 is slower than that of the spacer layers 120 and 140 (referring to FIG. 2). After the patterning process, the spacers 142 cover sidewalls of the openings 130O of the ILD layer 130 and leaves top surfaces of the ILD layer 130 and the metallization pattern 112 (e.g., bottom electrode via) uncovered.

Figure 5:
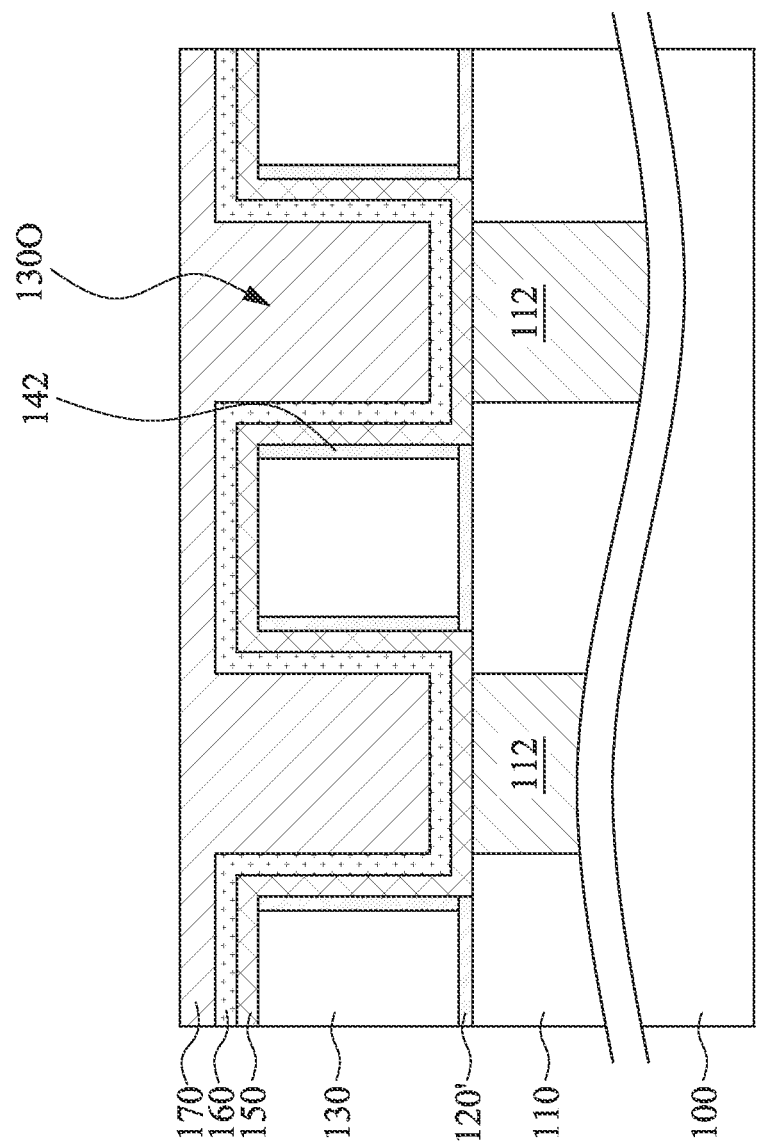

Reference is made to FIG. 5. A bottom electrode layer 150 is blanket formed over the structure of FIG. 4. The bottom electrode layer 150 may be deposited over the dielectric layer 130 and has a recess corresponding to the opening 130O of the dielectric layer 130. The bottom electrode layer 150 may be formed of conductive materials, such as copper, aluminum, tantalum, tungsten, tantalum nitride (TaN), titanium, titanium nitride (TiN), cobalt, tungsten, silver, ruthenium, AlCu, the like, and/or a combination thereof. The bottom electrode layer 150 may be a single-layered structure or a multilayered structure. For example, the bottom electrode layer 150 may include a tantalum nitride layer and a titanium nitride layer over the tantalum nitride layer. The bottom electrode layer 150 can be formed using suitable deposition techniques, such as chemical vapor deposition (CVD), physical vapor deposition (PVD), atomic layer deposition (ALD), the like, and/or combinations thereof.

A resistance switching layer 160 is then formed over the bottom electrode layer 150. In some embodiments, the resistance switching layer 160 may include a magnetic tunnel junction (MTJ) structure including various layers formed of different combinations of materials. For example, the MTJ structure may include plural films including Co, Fe, B, MgO, Mg, Co, W, CoFeB, TiN, TaN, Cu, Pt, Ni, and Ru. The films of the MTJ structure may be formed using suitable deposition techniques, such as CVD, PVD, ALD, the like, and/or combinations thereof.

In some exemplary embodiments where the resistance switching layer 160 includes the MTJ structure, it may include a pinning layer, a tunnel barrier layer, and a free layer. In addition, the MTJ structure may have other variations including other layers, such as anti-ferro-magnetic layers. In some embodiments, the pinning layer is a ferromagnetic material layer. The ferromagnetic material can form permanent magnets and/or exhibit strong interactions with magnets. In some embodiments, the ferromagnetic material layer includes a cobalt-iron-boron (CoFeB) film. The ferromagnetic material layer may alternatively include other materials, such as CoFeTa, NiFe, Co, CoFe, CoPt, CoPd, FePt, or the alloy of Ni, Co and Fe. As one example, the CoFeB film is formed by PVD, or alternatively other suitable process. In some embodiments, the tunnel barrier layer is formed of MgO, $AlO_x$, aluminum nitride (AlN), aluminum oxynitride (AlON), or other suitable non-magnetic material. In some embodiments, the free layer may also include a ferromagnetic material but it is not pinned. The free layer may include a ferromagnetic material similar to the ferromagnetic material used in the pinning layer. For example, the free layer includes CoFeB. The magnetic moment of the free layer may be programmed causing the resistance of the resulting MTJ cell to be changed between a high resistance and a low resistance.

In some embodiments where resistive random access memory (RRAM) cells are to be formed on the wafer, the resistance switching layer 160 may include a RRAM dielectric layer such as metal oxide composite, such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$) as in its relative high resistance state and a metal such as titanium (Ti), hafnium (Hf), platinum (Pt), ruthenium (Ru), and/or aluminum (Al) as in its relative low resistance state.

In some embodiments, a top electrode layer 170 is then formed over the resistance switching layer 160 and overfilling the opening 130O. The top electrode layer 170 may overfill the recess in the bottom electrode layer 150. The top electrode layer 170 may be formed using suitable deposition techniques, such as CVD, PVD, ALD, the like, and/or combinations thereof. The top electrode layer 170 may be formed of conductive materials, such as copper, aluminum, tantalum, tungsten, tantalum nitride (TaN), titanium, titanium nitride (TiN), the like, and/or a combination thereof.

Figure 6:
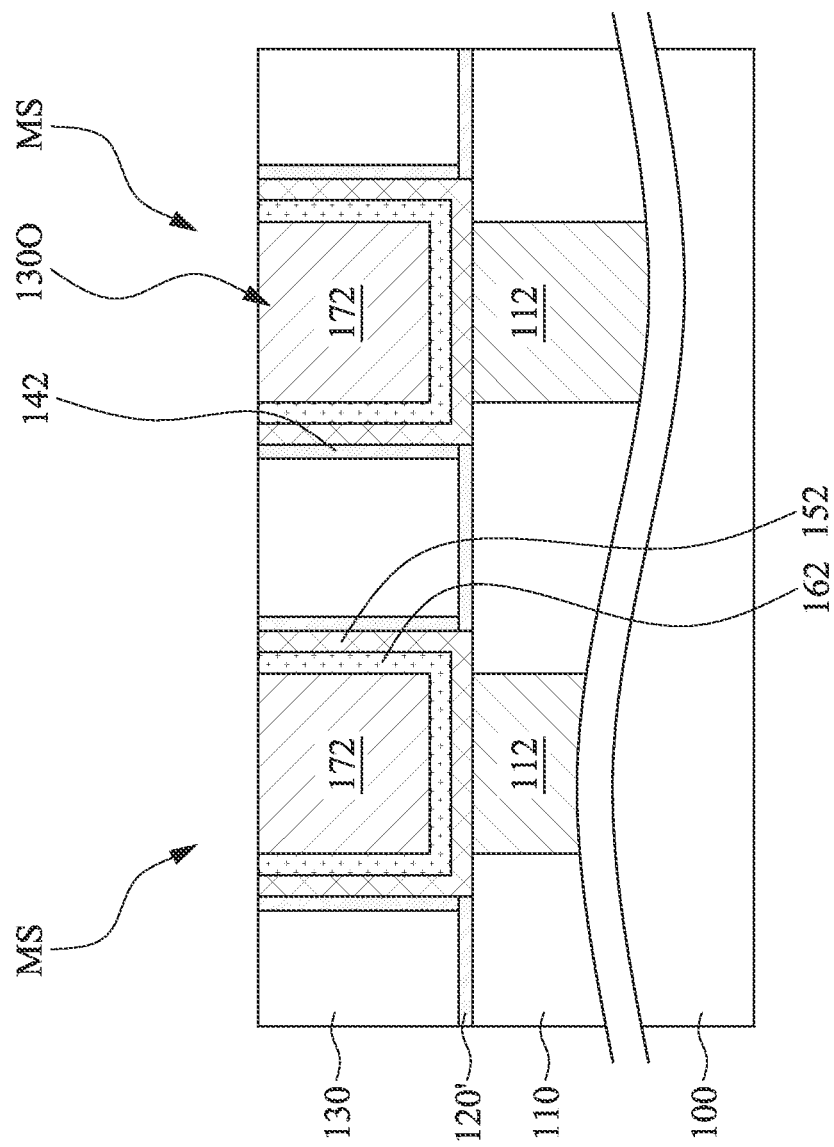

Reference is made to FIG. 6. A planarization process is performed to remove portions of the bottom electrode layer 150, the resistance switching layer 160, and the top electrode layer 170 (referring to FIG. 5) out of the openings 130O. For example, the planarization process includes a CMP process. After the planarization process, the remaining portions of the bottom electrode layer 150, the resistance switching layer 160, and the top electrode layer 170 (referring to FIG. 5) in the openings 130O are referred to as bottom electrodes 152, resistance switching elements 162, and top electrodes 172, respectively.

After the planarization process, plural memory structures MS are formed in the ILD layer 130 between the spacers 142, in which each of the memory structures MS include a bottom electrode 152, a resistance switching element 162, and a top electrode 172. The resistance switching element 162 may surround the top electrode 172. The bottom electrode 152 may surround the resistance switching element 162 and the top electrode 172. The top surfaces of the bottom electrode 152 and resistance switching element 162 are higher than a bottom surface of the top electrode 172. The resistance switching element 162 may be spaced apart from the first dielectric layer 130 by the bottom electrode 152. For example, the bottom electrode 152 has a portion between the resistance switching element 162 and the ILD layer 130. In some embodiments, the planarization process may also be performed to the spacers 142 to remove a portion of the spacers 142, such that a height of the spacers 142 and the memory structures MS is reduced.

Figure 7:
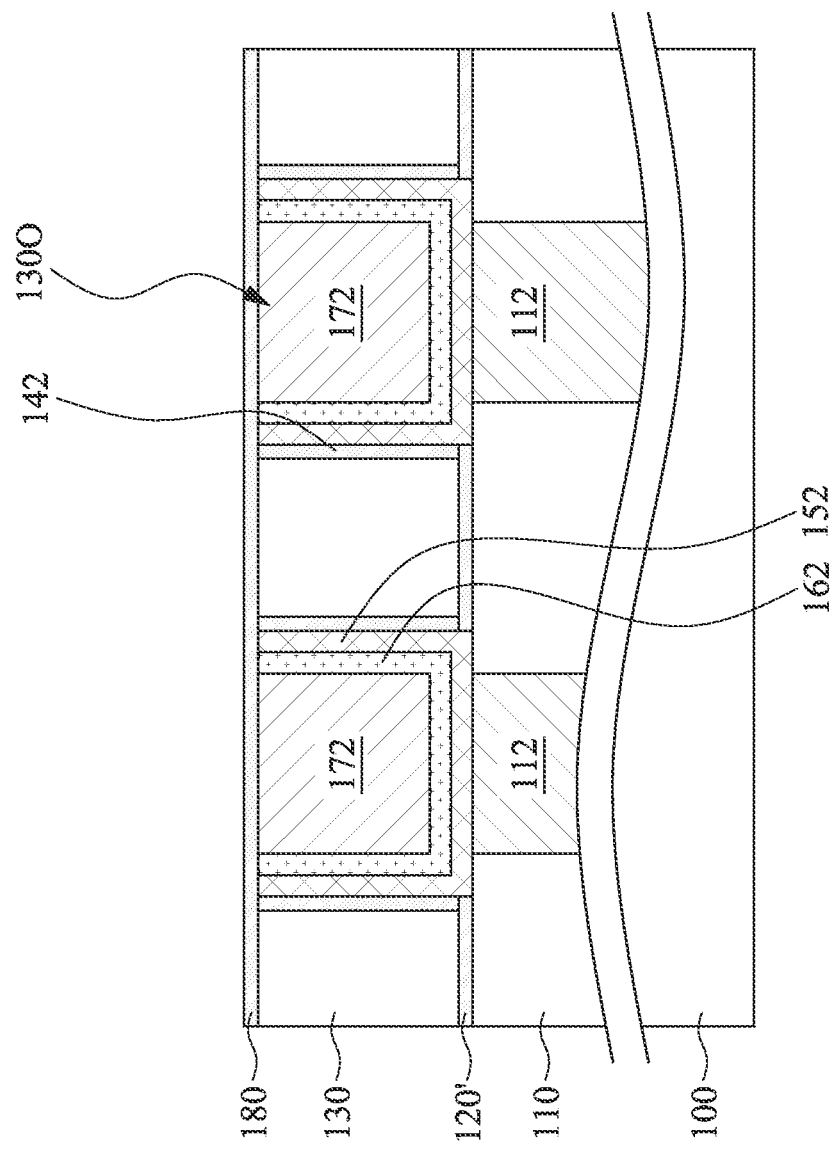

Reference is made to FIG. 7. A passivation layer 180 is blanket formed over the structure of FIG. 6. The passivation layer 180 may include suitable passivation dielectric materials different from a material of the ILD layer 130. For example, the passivation layer 180 may include aluminum nitride, aluminum oxide, silicon nitride, silicon carbide, carbon-doped silicon nitride, silicon oxide, carbon-doped silicon oxide, silicon oxynitride, and combinations thereof. In some embodiments, the passivation layer 180 may also be a composite layer including two or more layers made of different materials, such as a silicon nitride/silicon carbide stack. The passivation layer 180 may be formed using CVD, PVD, ALD, the like, and/or combinations thereof. The material of the passivation layer 180 may be the same as or different from that of the first spacer layer 120 or that of the second spacer layer 140.

Figure 8:
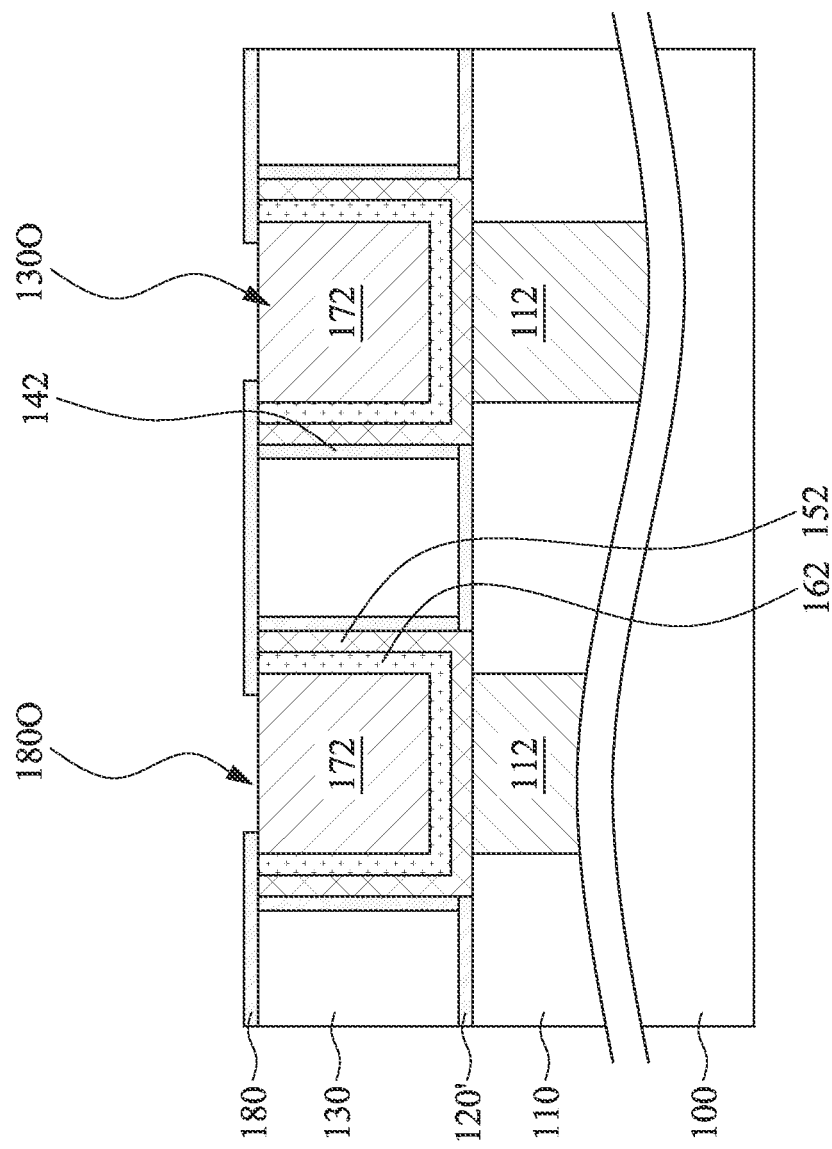

Reference is made to FIG. 8. The passivation layer 180 is patterned to have openings 180O exposing portions of the top electrodes 172. The patterned passivation layer 180 may cover top surfaces of the bottom electrodes 152, the resistance switching elements 162, and the ILD layer 130 and expose a top surface of the top electrodes 172. In some embodiments, the patterned passivation layer 180 may covers a portion of the top surface of the top electrode 172. In some embodiments, the patterning of the passivation layer 180 may include an etch process using acceptable photolithography techniques. For example, a photoresist is formed on the passivation layer 180, and a photolithography process is performed to pattern the photoresist. Then, the openings 180O are etched in the passivation layer 180 using the patterned photoresist as an etch mask, so as to expose portions of the top electrodes 172. The etch process may be dry etching, wet etching, or a combination thereof. In some embodiments where the passivation layer 180 is silicon nitride, the patterning of the silicon nitride layer includes a dry etching using $CH_2F_2$, $CH_2F_4$, $CH_xF_y$, $SF_6$, or $C_xF_y$ as an etchant, although other applicable etchants may be used. The top electrodes 172 may have a higher etch resistance to the etch process than that of the passivation layer 180. After the etching process, the patterned photoresist over the passivation layer 180 can be removed using, for example, an ashing process.

Figure 9:
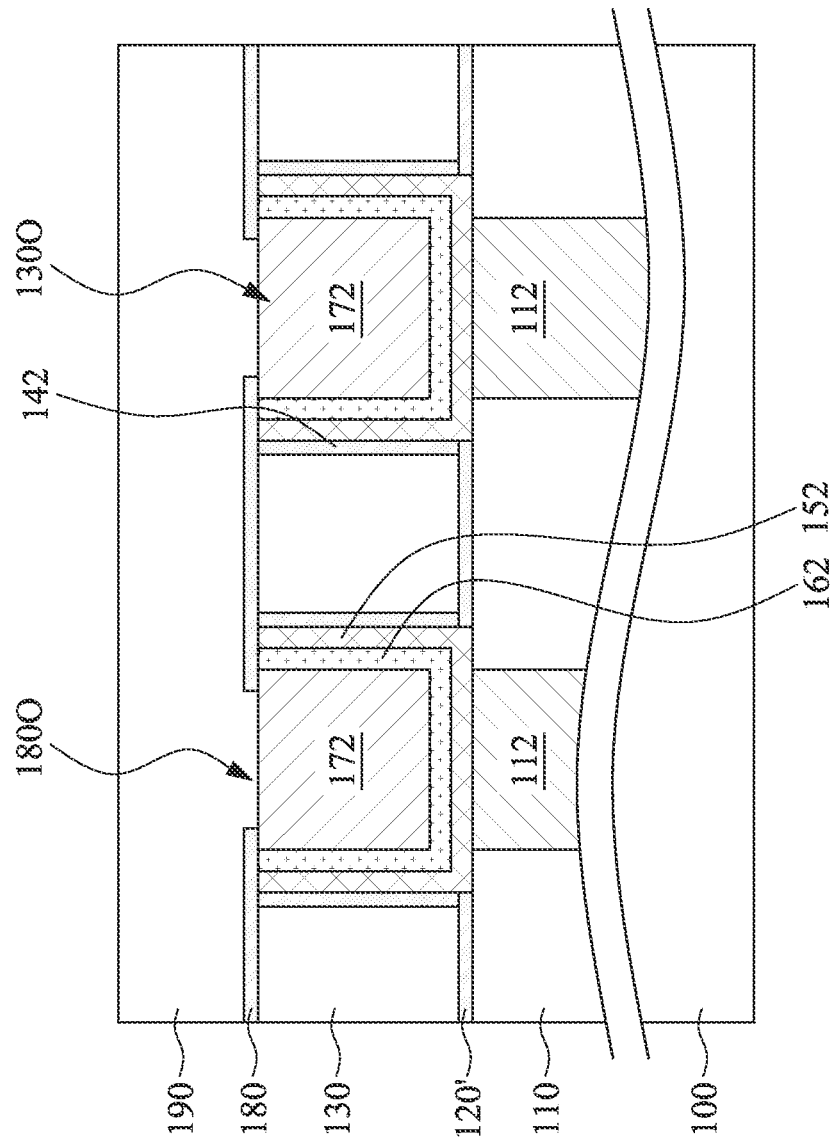

Reference is made to FIG. 9. An interlayer dielectric (ILD) layer 190 is formed on the first spacer layer 120. The ILD layer 190 may include suitable dielectric materials different from a material of the passivation layer 180. For example, the ILD layer 190 may be an extra low-k dielectric (ELK) layer, such as carbon-doped silicon oxide, may be an oxide, such as silicon oxide, and/or may be the like or a combination thereof. In some embodiments, the ILD layer 190 may be formed of a low-k dielectric material having a k value less than about 3.9. The k value of the ILD layer 190 may even be lower than about 2.8. The ILD layer 190 may have the same material as the underlying ILD layer 130 or the ILD layer 110.

Figure 10:
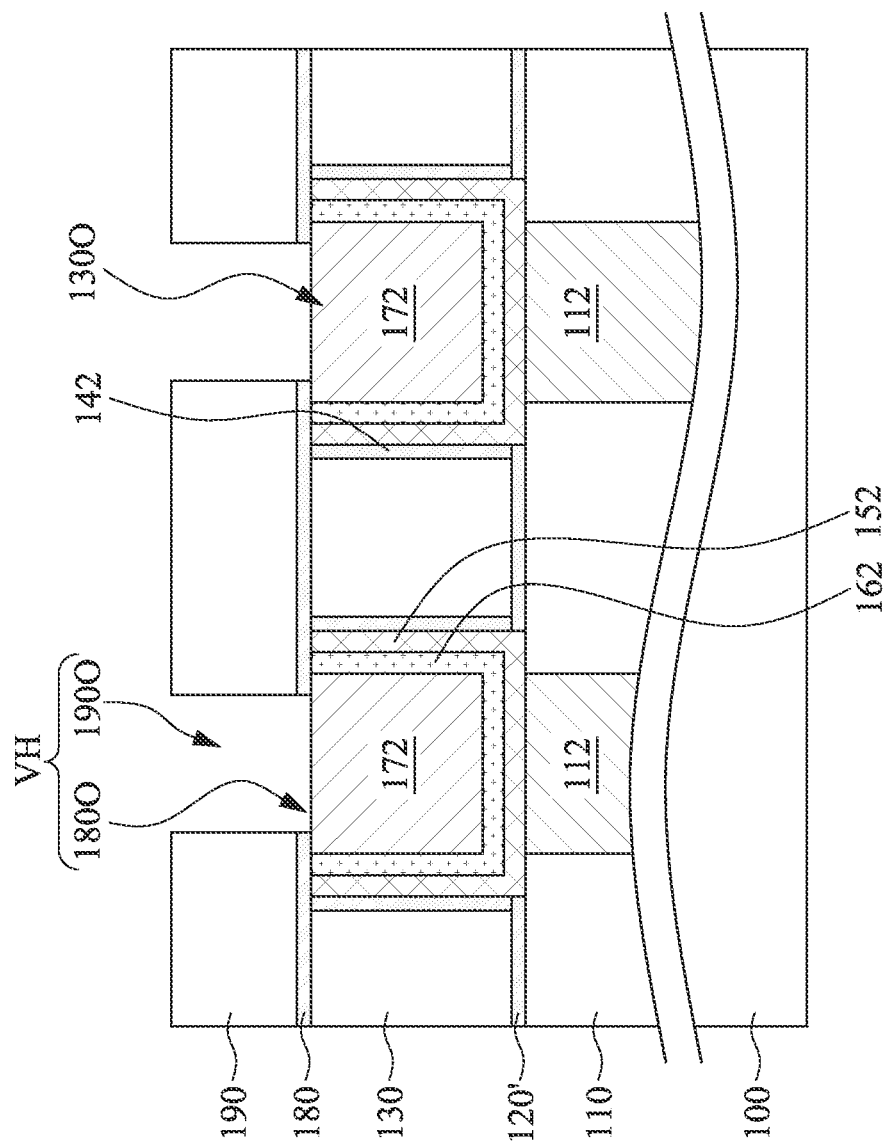

Reference is made to FIG. 10. The ILD layer 190 is patterned to form one or more openings 190O exposing portions of the top electrodes 172. The openings 190O may communicate with the openings 180O, and the openings 180O and 190O in combination forms top via holes VH. For example, a photoresist is formed on the ILD layer 190, and a photolithography process is performed to pattern the photoresist. Then, the openings 190O are etched in the ILD layer 190 using the patterned photoresist as an etch mask, so as to expose portions of the top electrodes 172. In some embodiments where the ILD layer 190 is silicon oxide, the etchant used in etching the openings 190O can be dilute hydrofluoric acid (HF), HF vapor, $CF_4$, $C_4F_8$, $CH_xF_y$, $C_xF_y$, $SF_6$, or $NF_3$ gas. To be specific, a portion of the ILD layer 190 over the top electrodes 172 is removed until reaching the top electrodes 172. The top electrodes 172 may have a higher etch resistance to an etchant used in etching the openings 190O in the ILD layer 190 than that of the ILD layer 190. For example, in an etching process using dilute HF, HF vapor, $CF_4$, $C_4F_8$, $CH_xF_y$, $C_xF_y$, $SF_6$, or $NF_3$ gas as an etchant, an etch rate of the top electrodes 172 is slower than that of the ILD layer 190. In some embodiments, the passivation layer 180 has higher etch resistance to an etchant used in the removing the portion of the ILD layer 190 (or the etching the openings 190O) than that of the ILD layer 190, such that the passivation layer 180 may protect the underlying bottom electrodes 152 and resistance switching elements 162 from being damage in the etching the openings 190O. For example, in an etching process using dilute HF, HF vapor, $CF_4$, $C_4F_8$, $CH_xF_y$, $C_xF_y$, $SF_6$, or $NF_3$ gas as an etchant, an etch rate of the passivation layer 180 is slower than that of the ILD layer 190. After the etching process, the patterned photoresist over the ILD layer 190 can be removed using, for example, an ashing process.

Figure 11A:
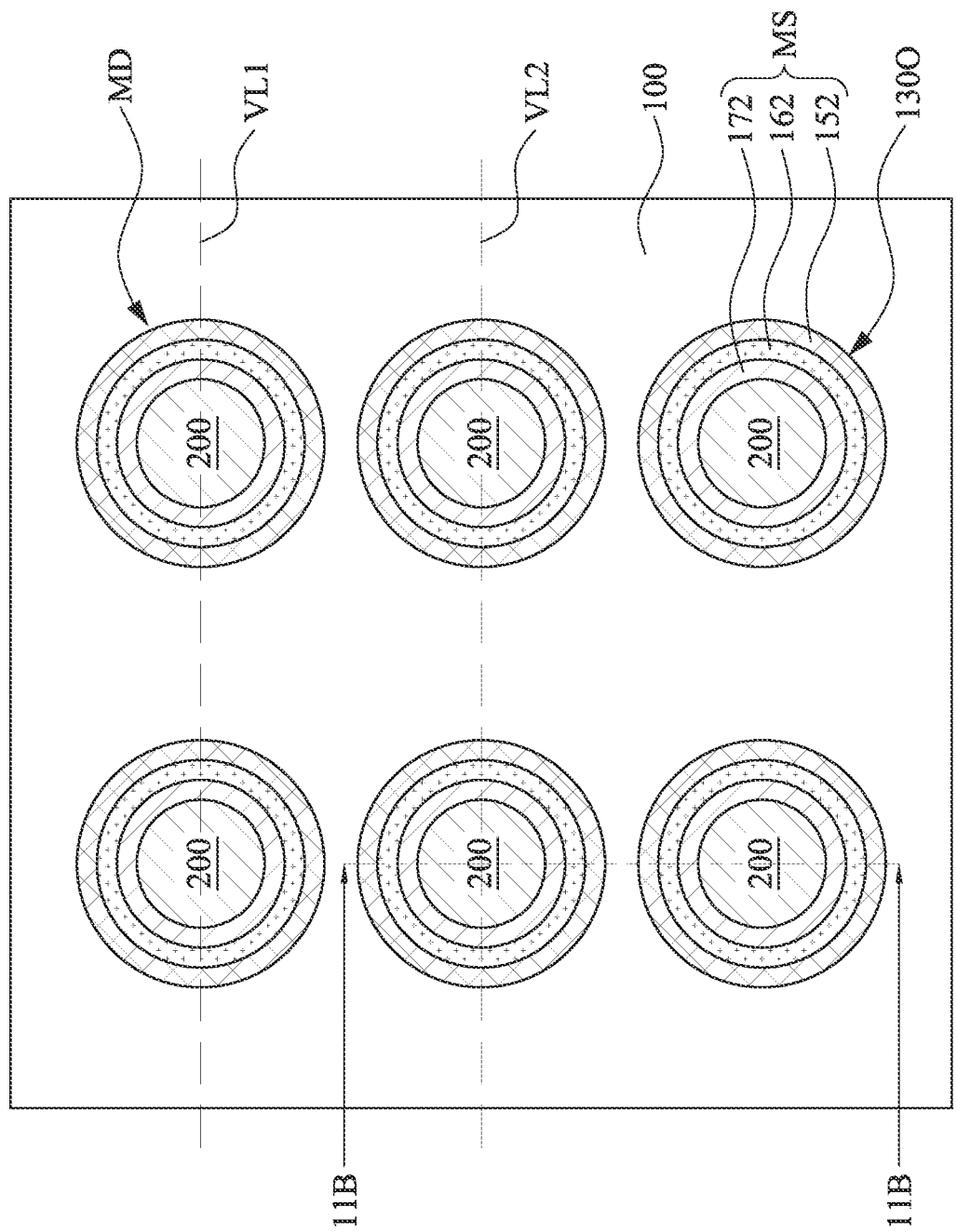
Figure 11B:
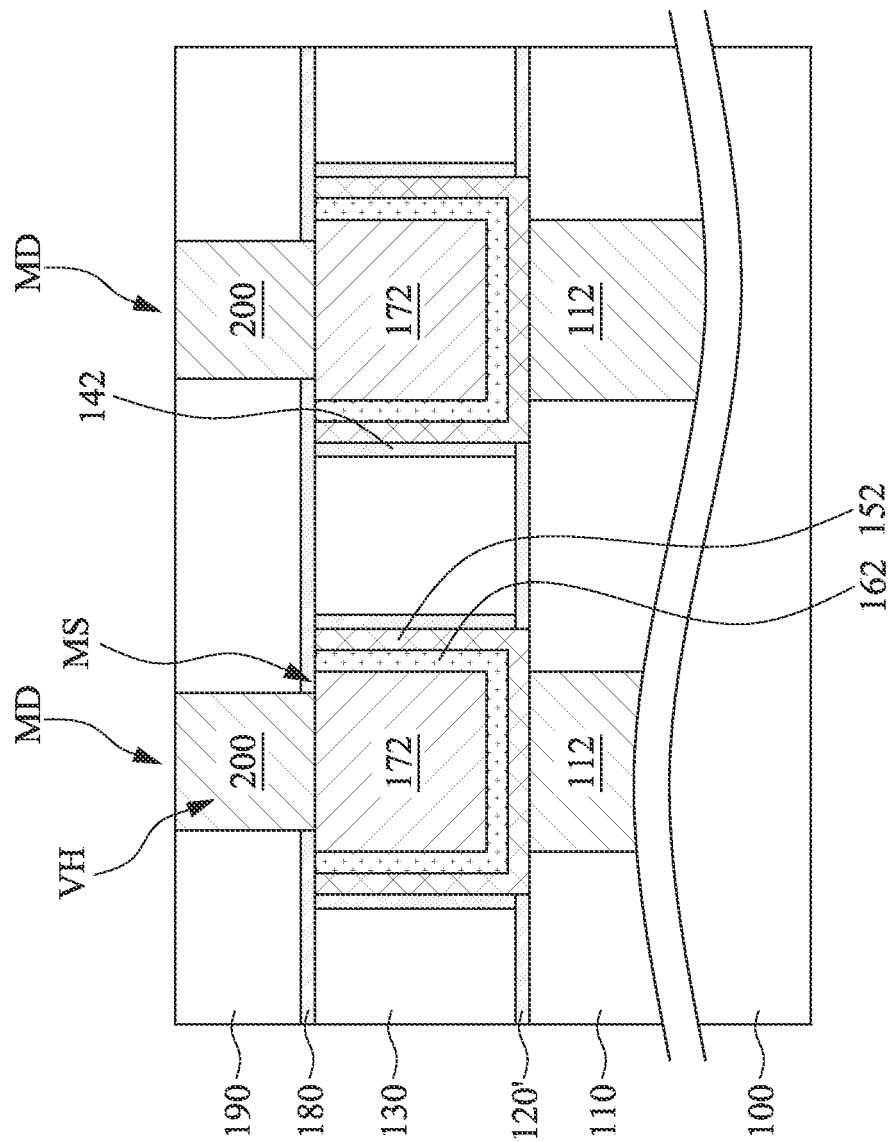

Reference is made to FIGS. 11A and 11B. FIG. 11B is a cross-sectional view taken along line 11B-11B of FIG. 11A. Electrode vias 200 are formed into the top via holes VH respectively and in contact with the top electrodes 172 respectively. The electrode vias 200 may include conductive material, such as metal. The electrode vias 200 may also include one or more liner and barrier layers in additional to a metal conductor. The liner and/or barrier may be conductive and deposited using CVD or PVD. The metal may be deposited using PVD or one of the plating methods, such as electrochemical plating. The deposited metal may overfill the top via holes VH. A planarization process, such as a CMP process, is then performed to planarize the electrode vias 200 and the ILD layer 190.

As illustrated in FIGS. 11A and 11B, plural memory devices MD are formed. Each of the memory devices MD includes a memory structure MS, spacers 142, and the passivation layer 180. The memory structure MS has the bottom electrode 152, the resistance switching element 162, the top electrode 172 between the spacers 142. The spacer 142 is between the ILD layer 130 and the bottom electrode 152. The resistance switching element 162 surrounds the top electrode 172, and the bottom electrode 152 surrounds the resistance switching element 162 and the top electrode 172, thereby increasing an effective area of the memory device MD. The passivation layer 180 covers top surfaces of the bottom electrode 152 and the resistance switching element 162, and thereby electrically isolate the electrode vias 200 from the bottom electrode 152 and the resistance switching element 162. In some embodiments, the passivation layer 180 further covers portions of top surfaces of the top electrodes 172, thereby ensuring the electrically isolation between the electrode vias 200 and the resistance switching element 162. In some embodiments, a width of the electrode vias 200 is less than a width of the top electrodes 172, thereby ensuring the electrically isolation between the electrode vias 200 and the resistance switching element 162.

In some embodiments, the opening 130O may be circular, and the memory structure MS in the opening 130O may have a circular top surface as shown in FIG. 11A. In some embodiments, the memory devices MD are arranged in plural parallel lines, and the memory devices MD in one of the lines (e.g., virtual line VL1) are aligned with the memory devices MD in another line (e.g., virtual line VL2) adjoining said one of the lines. For example, the memory devices MD are arranged in a matrix having columns and rows.

Figure 12:
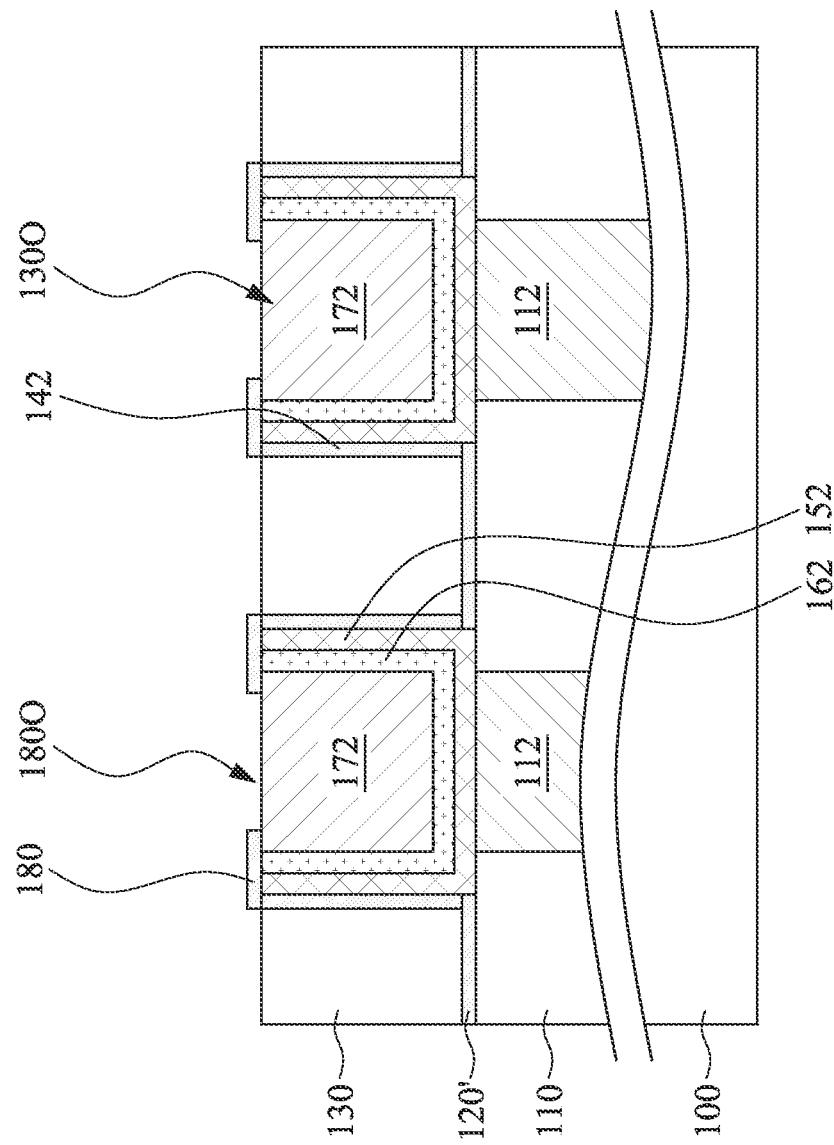
FIGS. 12-13 are cross-sectional views of a memory device at various intermediate stages of manufacture according to various embodiments of the present disclosure.
Figure 13:
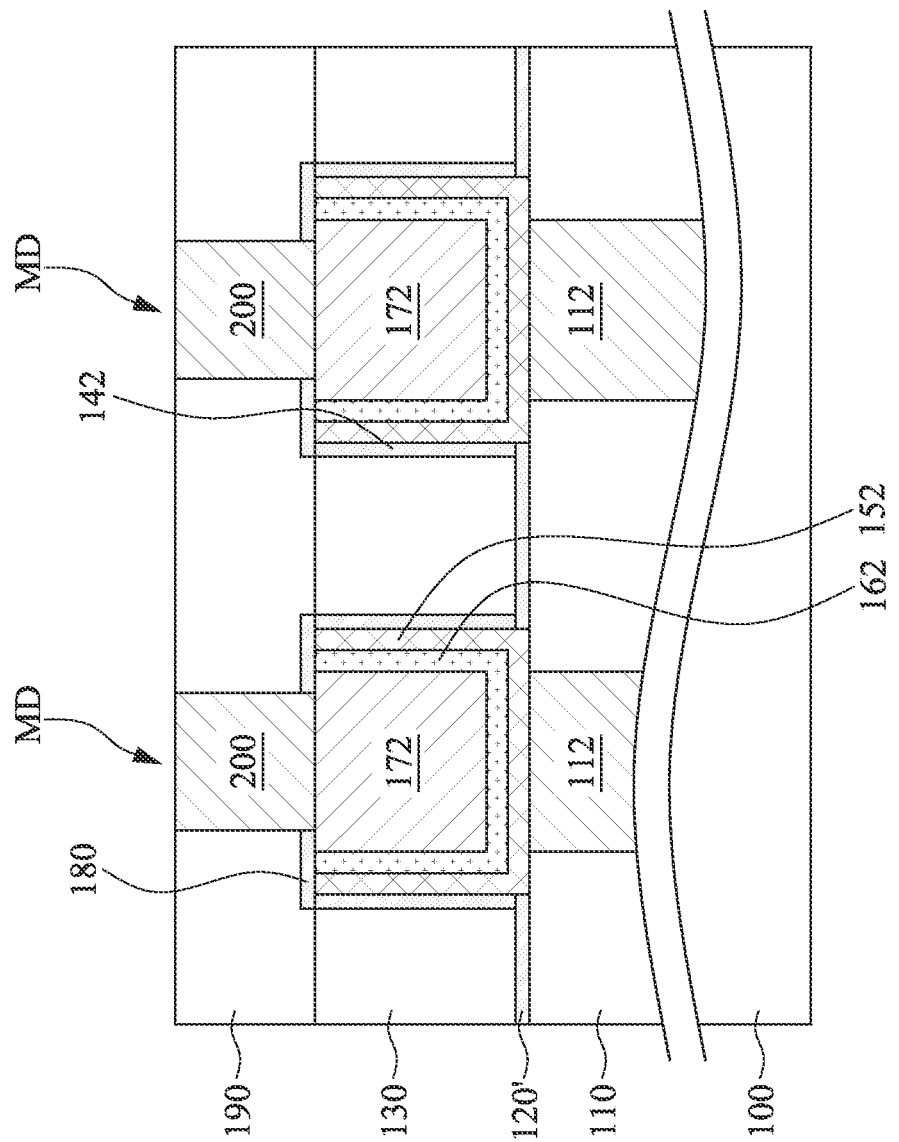

FIGS. 12-13 are cross-sectional views of a memory device at various intermediate stages of manufacture according to various embodiments of the present disclosure. The present embodiments are similar to the embodiments of FIGS. 1-11B, and the differences between the present embodiments and the embodiments of FIGS. 1-11B is at least that: after depositing the passivation layer 180 (referring to FIG. 7), the passivation layer 180 is patterned to exposing the portions of the top electrodes 172 and portions of the ILD layer 130 in the present embodiments.

Reference is made to FIG. 12. After depositing the passivation layer 180 (referring to FIG. 7), a patterning process is performed to remove a portion of the passivation layer 180 (referring to FIG. 7) over the top electrodes 172 and a portion of the passivation layer 180 (referring to FIG. 7) over the ILD layer 130. The patterned passivation layer 180 may cover tops of the bottom electrodes 152 and the resistance switching elements 162 and expose portions of the top electrodes 172 and the ILD layer 130. In some embodiments, the patterning of the passivation layer 180 may include an etch process using acceptable photolithography techniques. For example, a photoresist is formed on the passivation layer 180, and a photolithography process is performed to pattern the photoresist. Then, the passivation layer 180 is etched using the patterned photoresist as an etch mask, so as to expose portions of the top electrodes 172 and the ILD layer 130. In some embodiments where the passivation layer 180 is silicon nitride, the patterning of the silicon nitride layer includes a dry etching using $CH_2F_2$, $CH_2F_4$, $CH_xF_y$, $SF_6$, or $C_xF_y$ as an etchant, although other applicable etchants may be used. The top electrodes 172 and the ILD layer 130 may both have higher etch resistances to the etch process than that of the passivation layer 180.

Reference is made to FIG. 13. The ILD layer 190 and electrode vias 200 are formed over the structure of FIG. 12. The ILD layer 190 may be in contact with the ILD layer 130. Other details of the present embodiments are similar to those of the embodiments of FIGS. 1-11B, and therefore not repeated herein.

Figure 14:
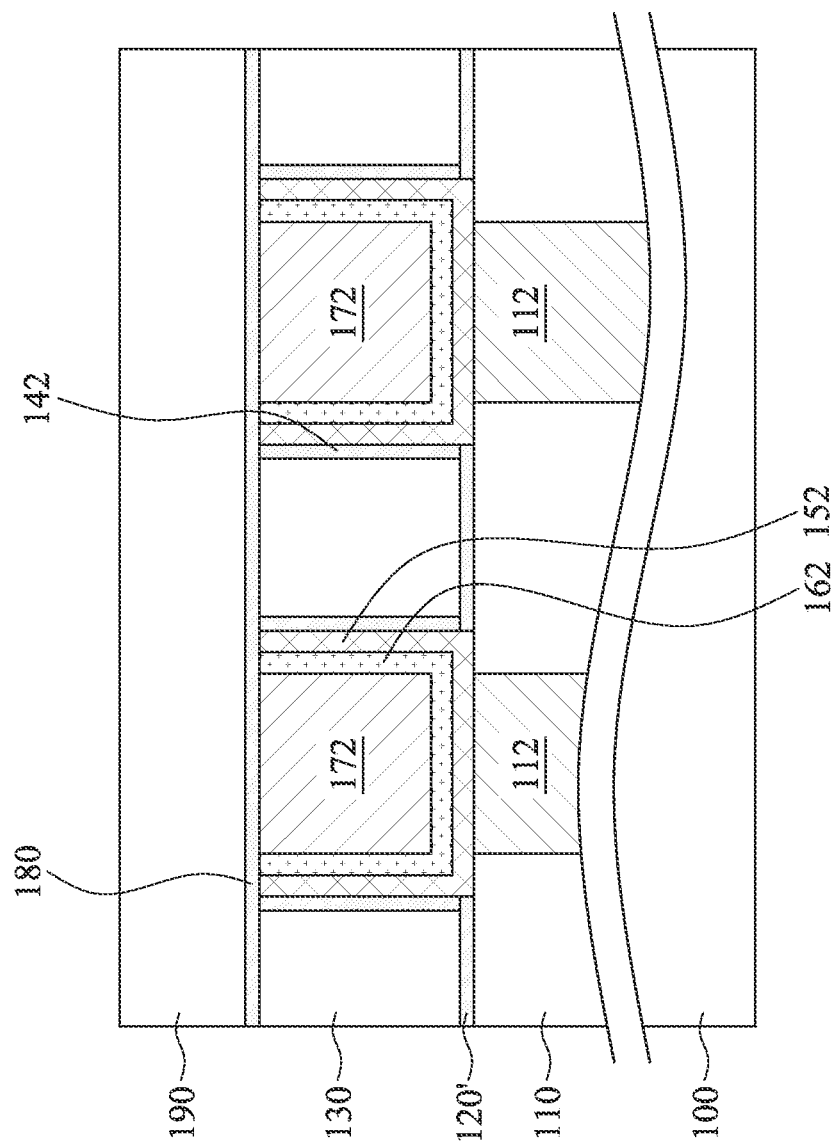
FIGS. 14-16 are cross-sectional views of a memory device at various intermediate stages of manufacture according to various embodiments of the present disclosure.
Figure 15:
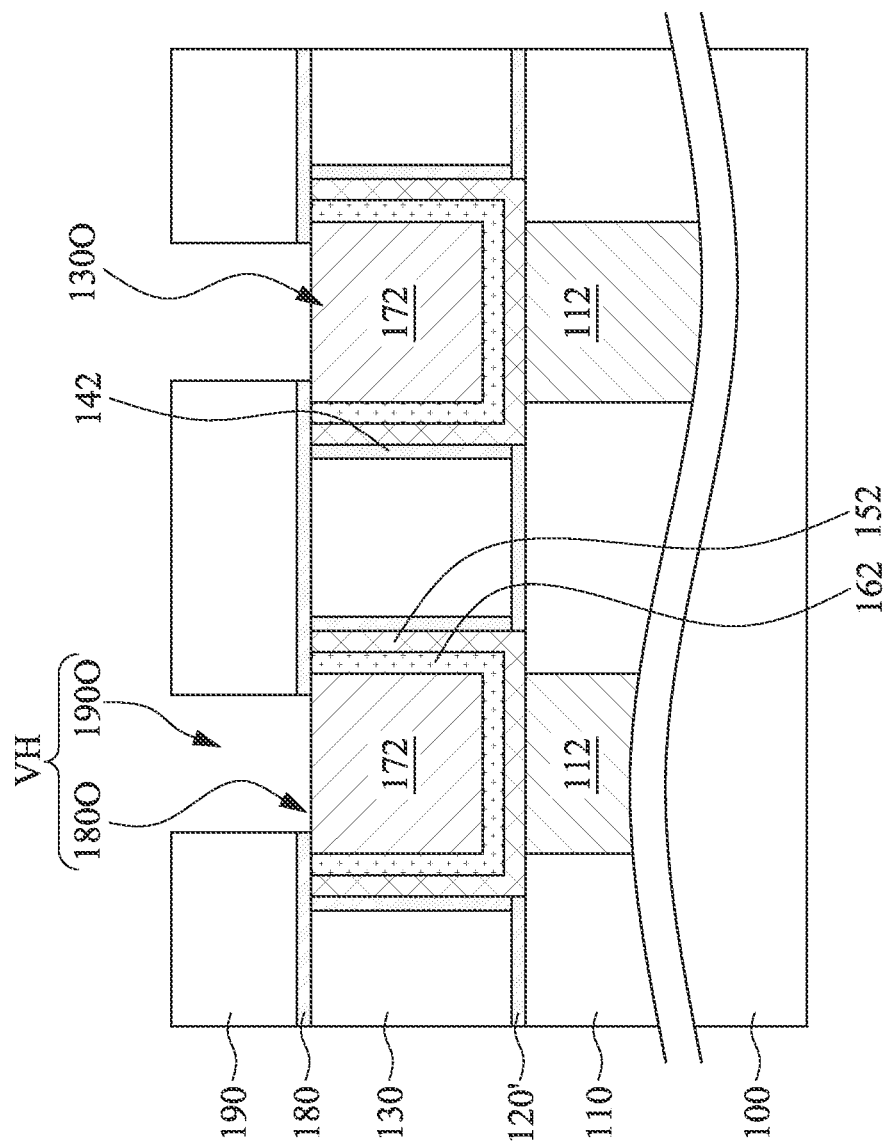
Figure 16:
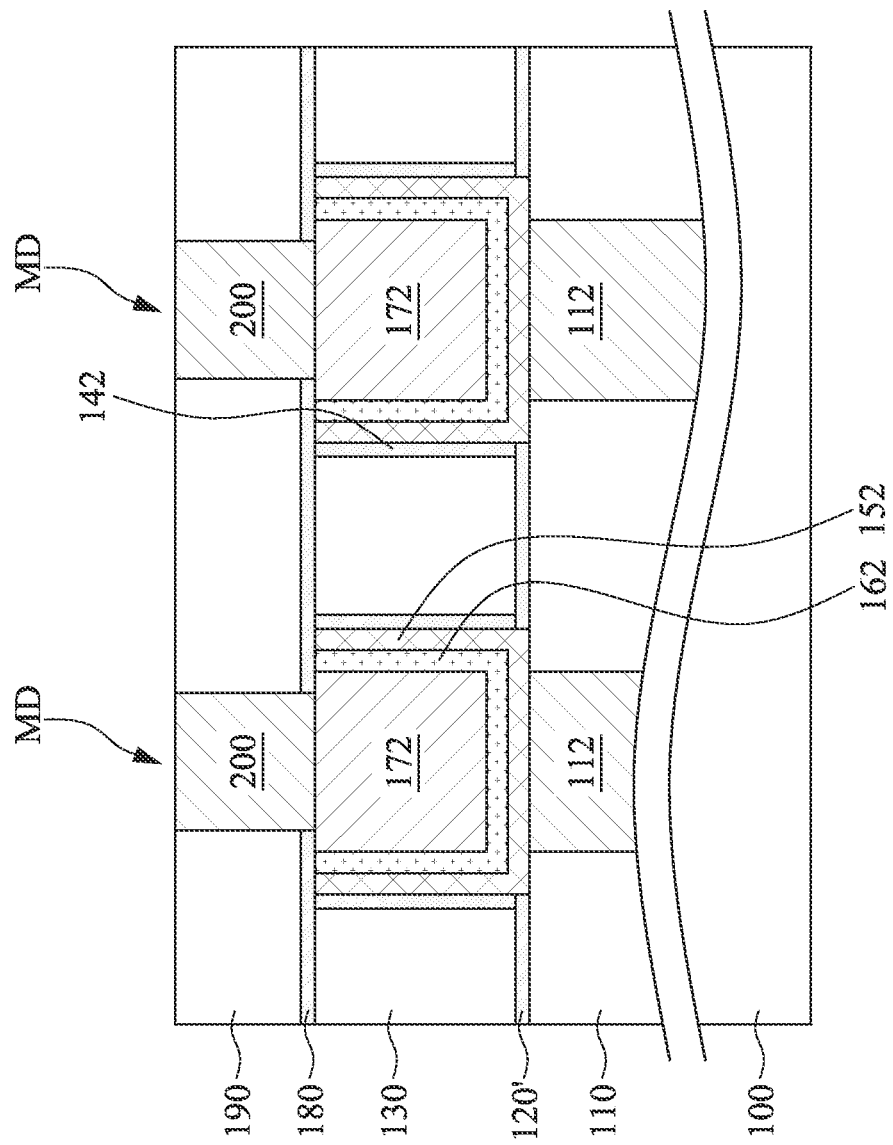

FIGS. 14-16 are cross-sectional views of a memory device at various intermediate stages of manufacture according to various embodiments of the present disclosure. The present embodiments are similar to the embodiments of FIGS. 1-11B, and the differences between the present embodiments and the embodiments of FIGS. 1-11B is at least that: the passivation layer 180 (referring to FIG. 7) is patterned after the formation of the ILD layer 190.

Reference is made to FIG. 14. After depositing the passivation layer 180 (referring to FIG. 7), the ILD layer 190 is formed over the passivation layer 180. As shown in FIG. 14, the ILD layer 190 is spaced apart from the top electrodes 172, the resistance switching elements 162, and the bottom electrodes 152 by the passivation layer 180.

Reference is made to FIG. 15. The ILD layer 190 and the passivation layer 180 are patterned to form one or more top via holes VH exposing the top electrodes 172. The patterning may include plural etching processes. For example, a first etching process is performed to etch openings 190O in the ILD layer 190. The passivation layer 180 may have a higher etch resistance to an etchant used in the first etching process than that of the ILD layer 190, such that the passivation layer 180 may protect the underlying top electrodes 172 from being damage in the first etching process. In some embodiments where the ILD layer 190 is silicon oxide, the etchant used in etching the openings 190O can be dilute hydrofluoric acid (HF), HF vapor, $CF_4$, $C_4F_8$, $CH_{xy}$, $C_xF_y$, $SF_6$, or $NF_3$ gas. For example, in an etching process using dilute HF, HF vapor, $CF_4$, $C_4F_8$, $CH_xF_y$, $C_xF_y$, $SF_6$, or $NF_3$ gas as an etchant, an etch rate of the passivation layer 180 is slower than that of the ILD layer 190. Then, after the first etching process, a second etching process is performed to etch openings 180O in the passivation layer 180. The openings 190O and the openings 180O in combination forms top via holes VH.

Reference is made to FIG. 16. The electrode vias 200 are formed into the top via holes VH respectively and in contact with the top electrodes 172 respectively. Other details of the present embodiments are similar to those of the embodiments of FIGS. 1-11B, and therefore not repeated herein.

Figure 17A:
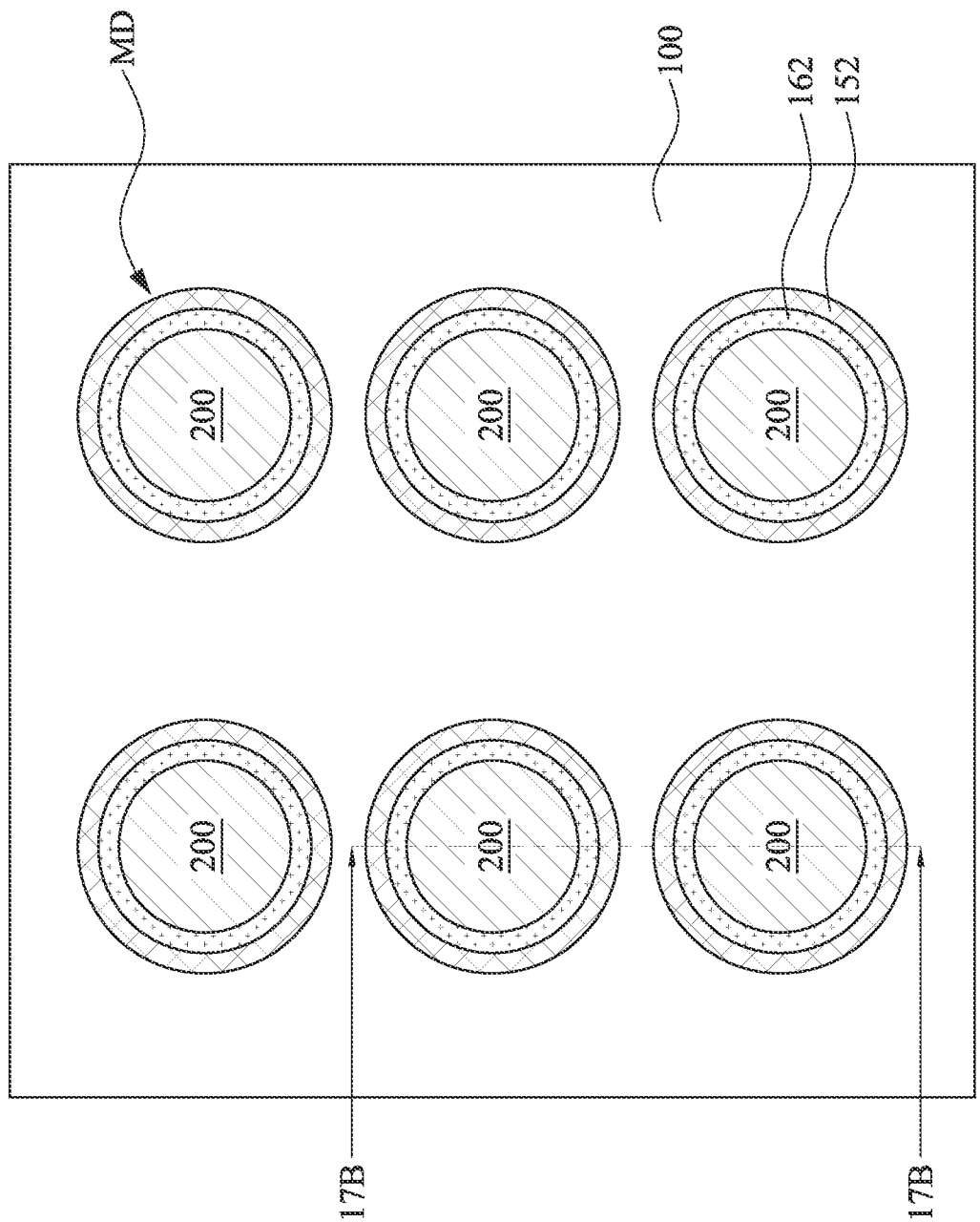
FIG. 17A is a schematic top view of an array of memory devices according to some embodiments of the present disclosure.
Figure 17B:
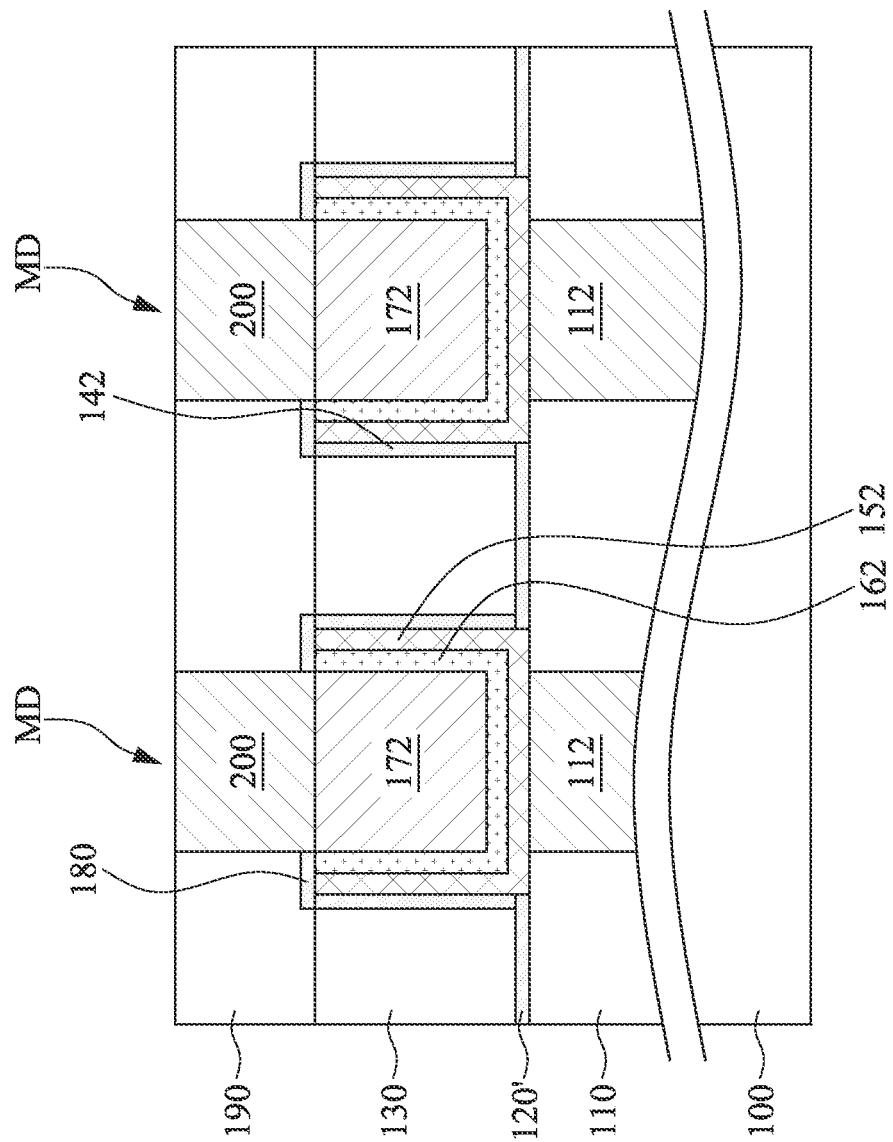
FIG. 17B is a cross-sectional view taken along line 17B-17B of FIG. 17A.

FIG. 17A is a schematic top view of an array of memory devices according to some embodiments of the present disclosure. FIG. 17B is a cross-sectional view taken along line 17B-17B of FIG. 17A. The present embodiments are similar to the embodiments of FIGS. 11A-11B, and the differences between the present embodiments and the embodiments of FIGS. 11A-11B is at least that: the passivation layer 180 may not cover the top surfaces of the top electrodes 172. In the present embodiments, the passivation layer 180 covers the top surfaces of the bottom electrode 152 and the resistance switching element 162, and exposes the entire top surfaces of the top electrodes 172. Through the configuration, the electrode vias 200 is formed with a width substantially equal to a width of the top electrodes 172. Other details of the present embodiments are similar to those of the embodiments of FIGS. 11A-11B, and therefore not repeated herein.

Figure 18:
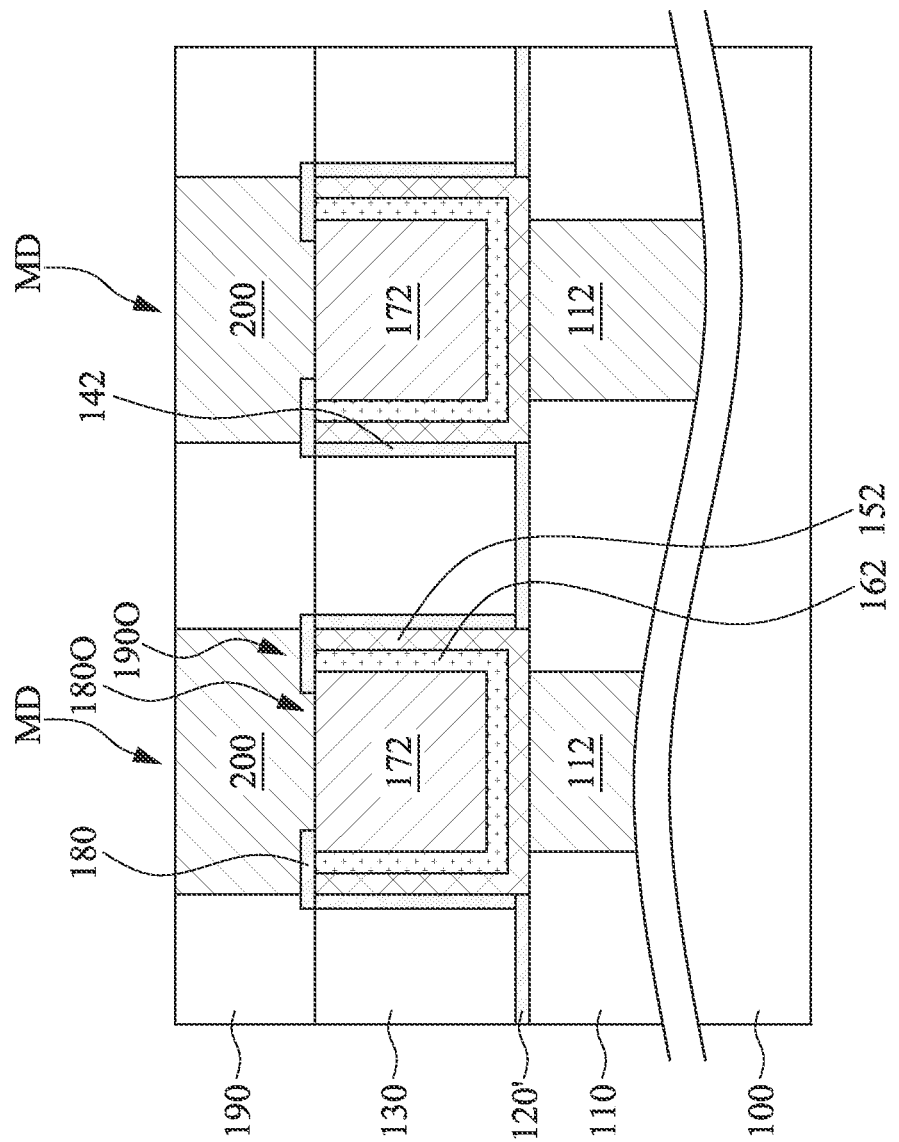
FIG. 18 is a cross-sectional view of a memory device according to some embodiments of the present disclosure.

FIG. 18 is a cross-sectional view of a memory device according to some embodiments of the present disclosure. The present embodiments are similar to the embodiments of FIG. 11B, and the differences between the present embodiments and the embodiments of FIG. 11B is at least that: a size of the opening 190O is greater than a size of the opening 180O, such that the opening 190O may expose a top surface of the passivation layer 180, and the electrode vias 200 formed in the openings 180O and 190O may be in contact with the top surface of the passivation layer 180. In the present embodiments, a width of the electrode vias 200 is greater than a width of the top electrodes 172. The passivation layer 180 may space the electrode vias 200 apart from the resistance switching element 162 and the bottom electrodes 152, and thereby electrically isolate the electrode vias 200 from the bottom electrode 152 and the resistance switching element 162. Other details of the present embodiments are similar to those of the embodiments of FIG. 11B, and therefore not repeated herein.

Figure 19:
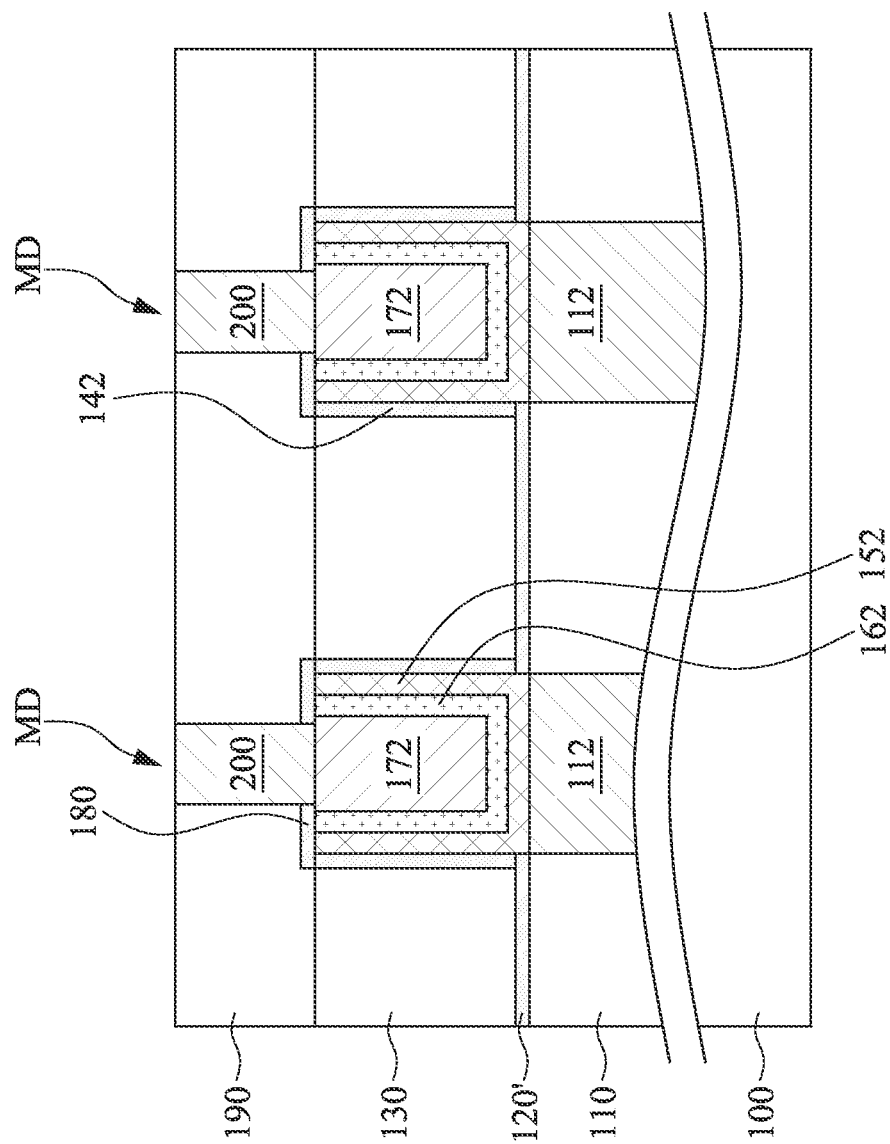
FIG. 19 is a cross-sectional view of a memory device according to some embodiments of the present disclosure.

FIG. 19 is a cross-sectional view of a memory device according to some embodiments of the present disclosure. The present embodiments are similar to the embodiments of FIG. 11B, and the differences between the present embodiments and the embodiments of FIG. 11B is at least that: a width of the bottom electrodes 152 is substantially equal to a width of a bottom electrode via of the metallization pattern 112. Other details of the present embodiments are similar to those of the embodiments of FIG. 11B, and therefore not repeated herein.

Figure 20:
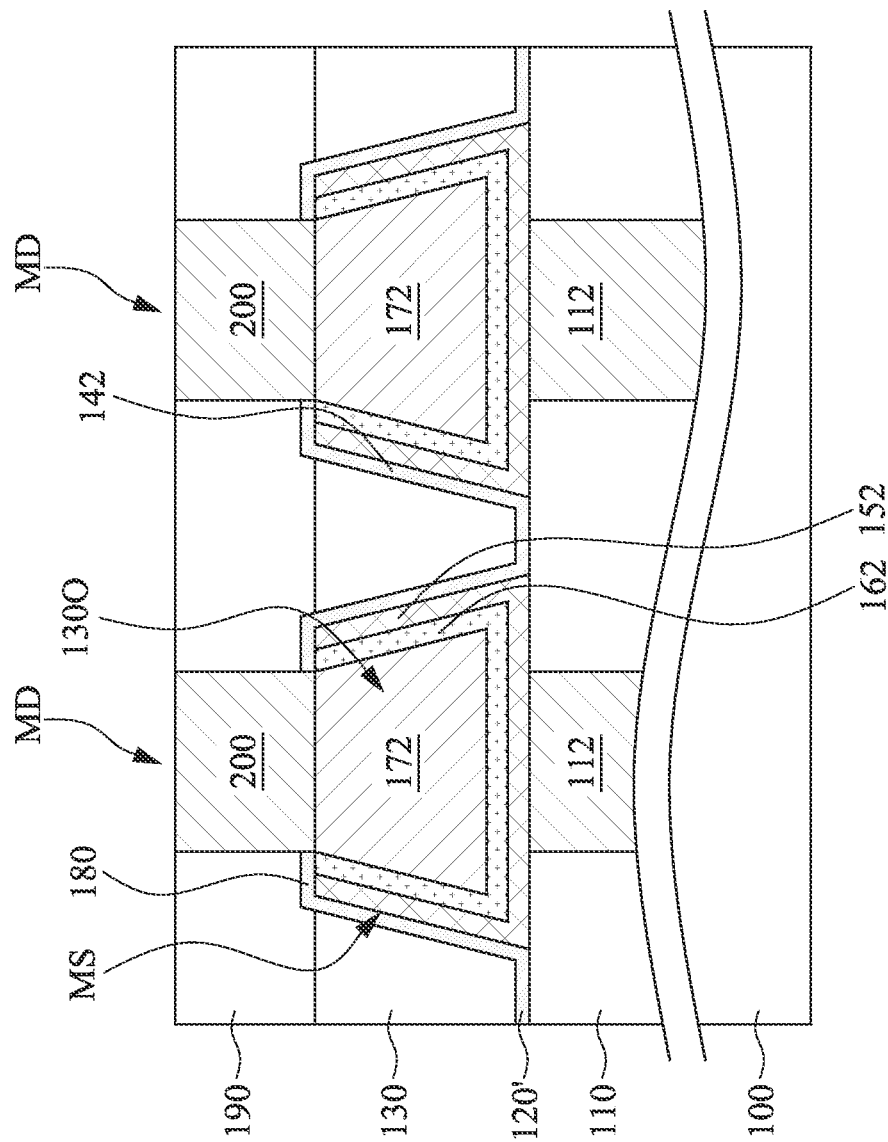
FIG. 20 is a cross-sectional view of a memory device according to some embodiments of the present disclosure.

FIG. 20 is a cross-sectional view of a memory device according to some embodiments of the present disclosure. The present embodiments are similar to the embodiments of FIG. 11B, and the differences between the present embodiments and the embodiments of FIG. 11B is at least that: the opening 130O in the ILD layer 130 get narrower upwards by tuning etch conditions. Through the configuration, an area of a bottom surface of the memory structure MS (i.e., a bottom surface of the bottom electrodes 152) is greater than an area of a top surface of the memory structure MS (i.e., a top surface of the top electrodes 172). The memory structure MS have sidewalls (e.g., sidewalls of the bottom electrodes 152) inclined with respect to a top surface of the substrate 100. The spacers 142 extend along the inclined sidewalls of the memory structure MS. Other details of the present embodiments are similar to those of the embodiments of FIG. 11B, and therefore not repeated herein.

Figure 21:
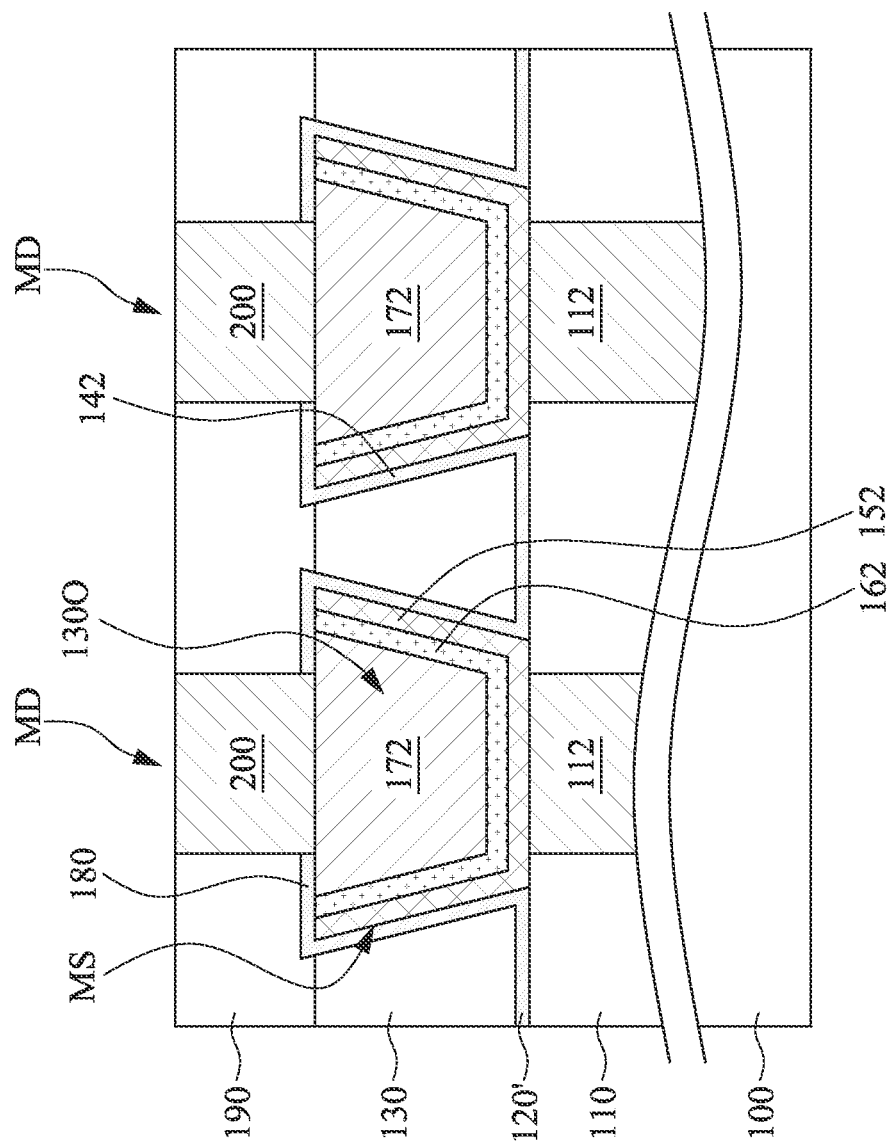
FIG. 21 is a cross-sectional view of a memory device according to some embodiments of the present disclosure.

FIG. 21 is a cross-sectional view of a memory device according to some embodiments of the present disclosure. The present embodiments are similar to the embodiments of FIG. 11B, and the differences between the present embodiments and the embodiments of FIG. 11B is at least that: the opening 130O in the ILD layer 130 get wider upwards by tuning etch conditions. Through the configuration, an area of a bottom surface of the memory structure MS (i.e., a bottom surface of the bottom electrodes 152) is smaller than an area of a top surface of the memory structure MS (i.e., a top surface of the top electrodes 172). The memory structure MS have sidewalls (e.g., sidewalls of the bottom electrodes 152) inclined with respect to a top surface of the substrate 100. The spacers 142 extend along the inclined sidewalls of the memory structure MS. Other details of the present embodiments are similar to those of the embodiments of FIG. 11B, and therefore not repeated herein.

Figure 22:
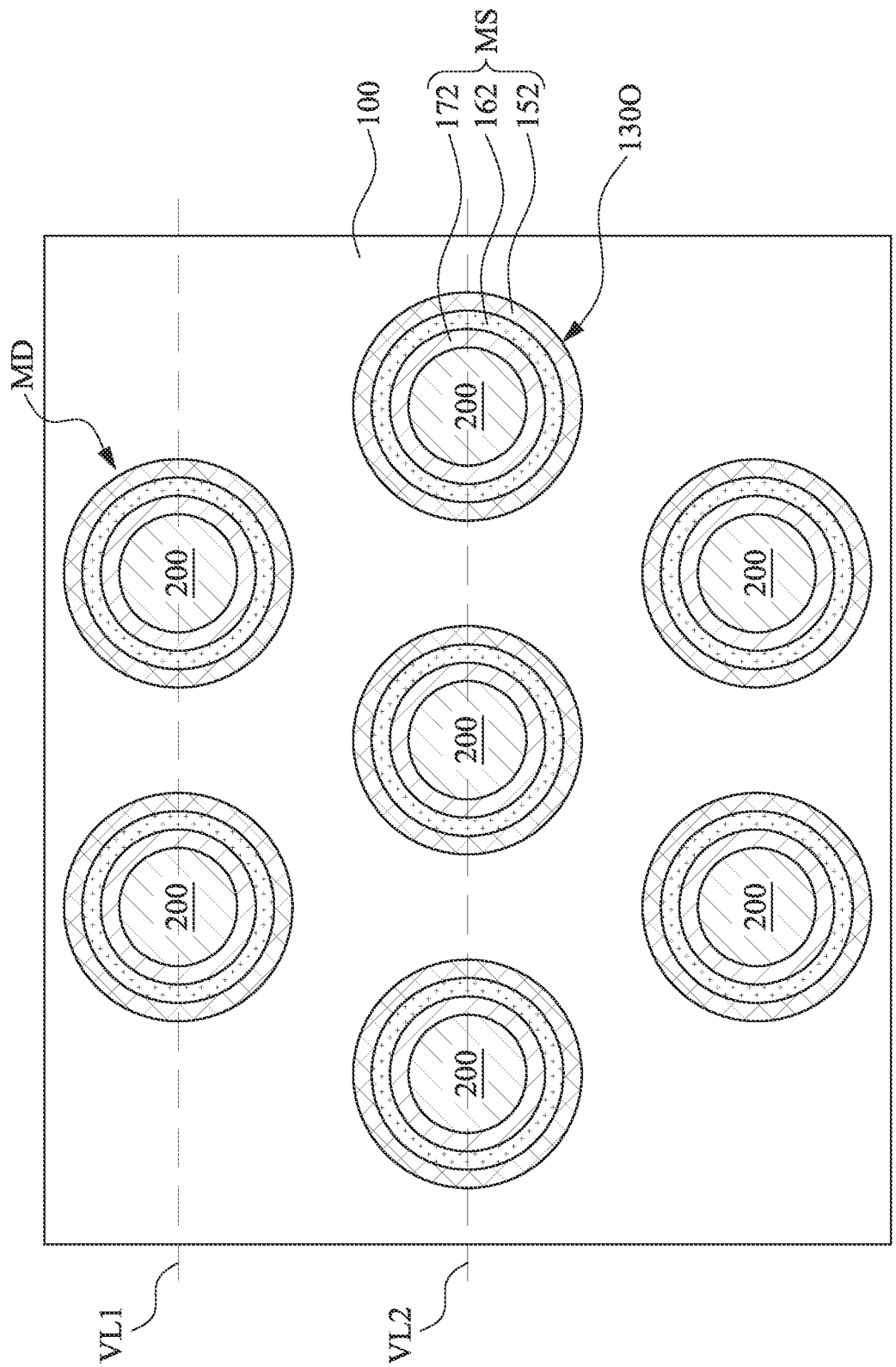
FIG. 22 is a schematic top view of an array of memory devices according to some embodiments of the present disclosure.

FIG. 22 is a schematic top view of an array of memory devices MD according to some embodiments of the present disclosure. The present embodiments are similar to the embodiments of FIG. 11A, and the differences between the present embodiments and the embodiments of FIG. 11A is at least that: the memory devices MD are arranged in plural parallel lines, and the memory devices MD in one of the lines (e.g., virtual line VL1) are misaligned with the memory devices MD in another line (e.g., virtual line VL2) adjoining said one of the lines. In the present embodiments, the memory devices MD are disposed in a hexagonal arrangement. Other details of the present embodiments are similar to those of the embodiments of FIG. 11A, and therefore not repeated herein.

Figure 23:
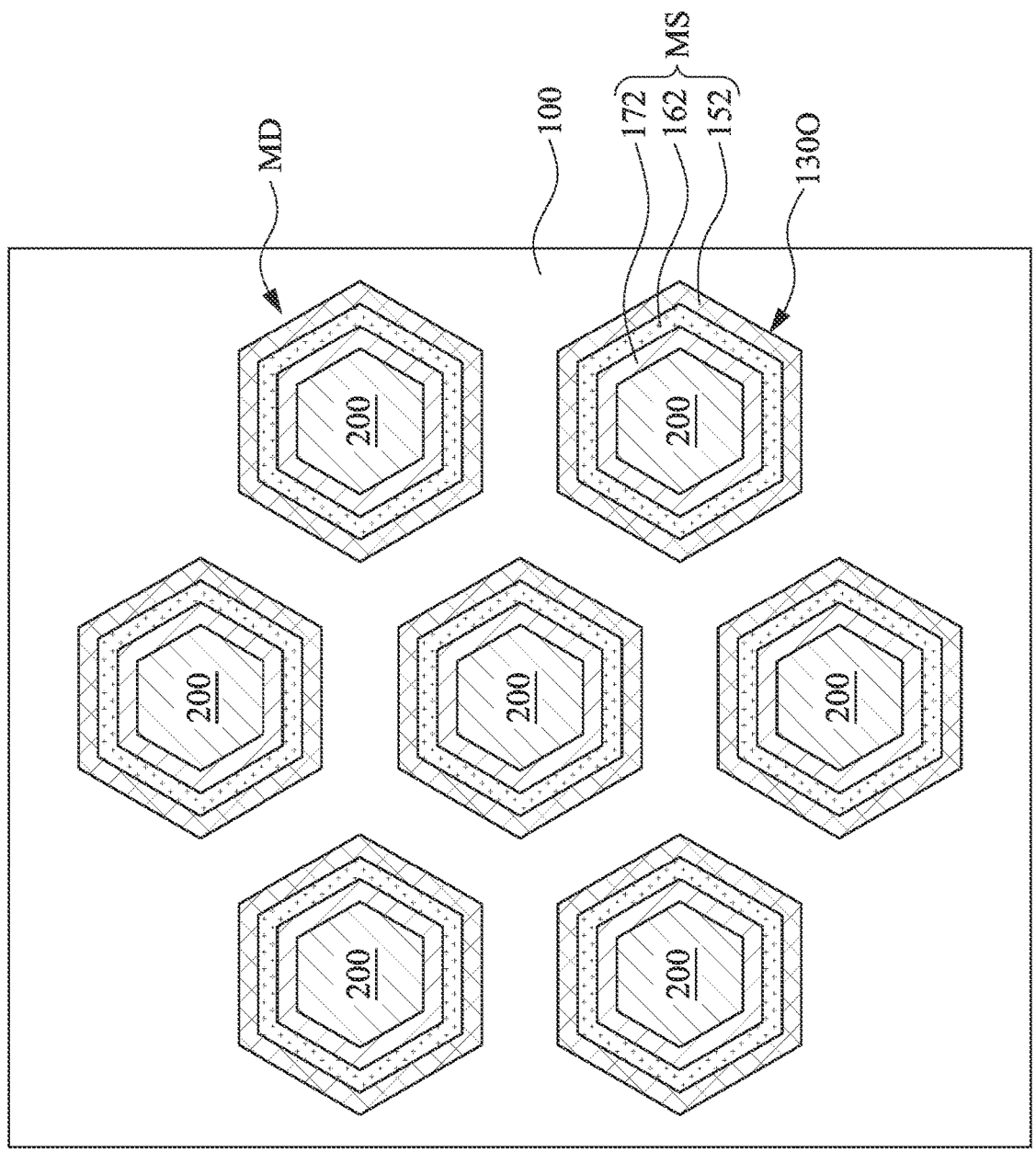
FIG. 23 is a schematic top view of an array of memory devices according to some embodiments of the present disclosure.

FIG. 23 is a schematic top view of an array of memory devices MD according to some embodiments of the present disclosure. The present embodiments are similar to the embodiments of FIG. 22, and the differences between the present embodiments and the embodiments of FIG. 22 is at least that: the opening 130O in the ILD layer 130 (referring to FIG. 11B) has a hexagonal top view, and the memory structure MS in the opening 130O may have a hexagonal top surface. Other details of the present embodiments are similar to those of the embodiments of FIG. 22, and therefore not repeated herein.

Figure 24:
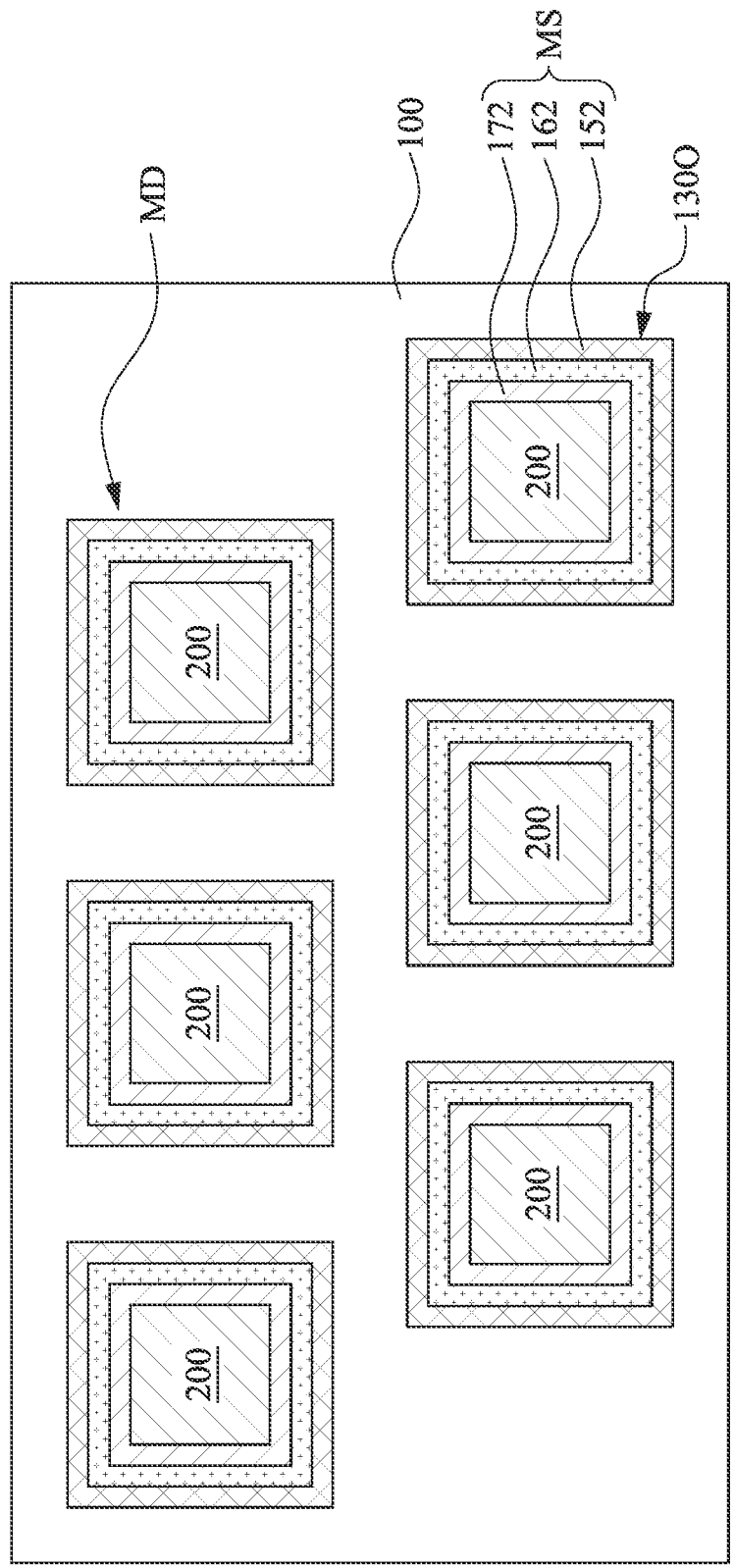
FIG. 24 is a schematic top view of an array of memory devices according to some embodiments of the present disclosure.

FIG. 24 is a schematic top view of an array of memory devices according to some embodiments of the present disclosure. The present embodiments are similar to the embodiments of FIG. 22, and the differences between the present embodiments and the embodiments of FIG. 22 is at least that: the opening 130O in the ILD layer 130 (referring to FIG. 11B) has a square top view, and the memory structure MS in the opening 130O may have a square top surface. Other details of the present embodiments are similar to those of the embodiments of FIG. 22, and therefore not repeated herein.

Figure 25:
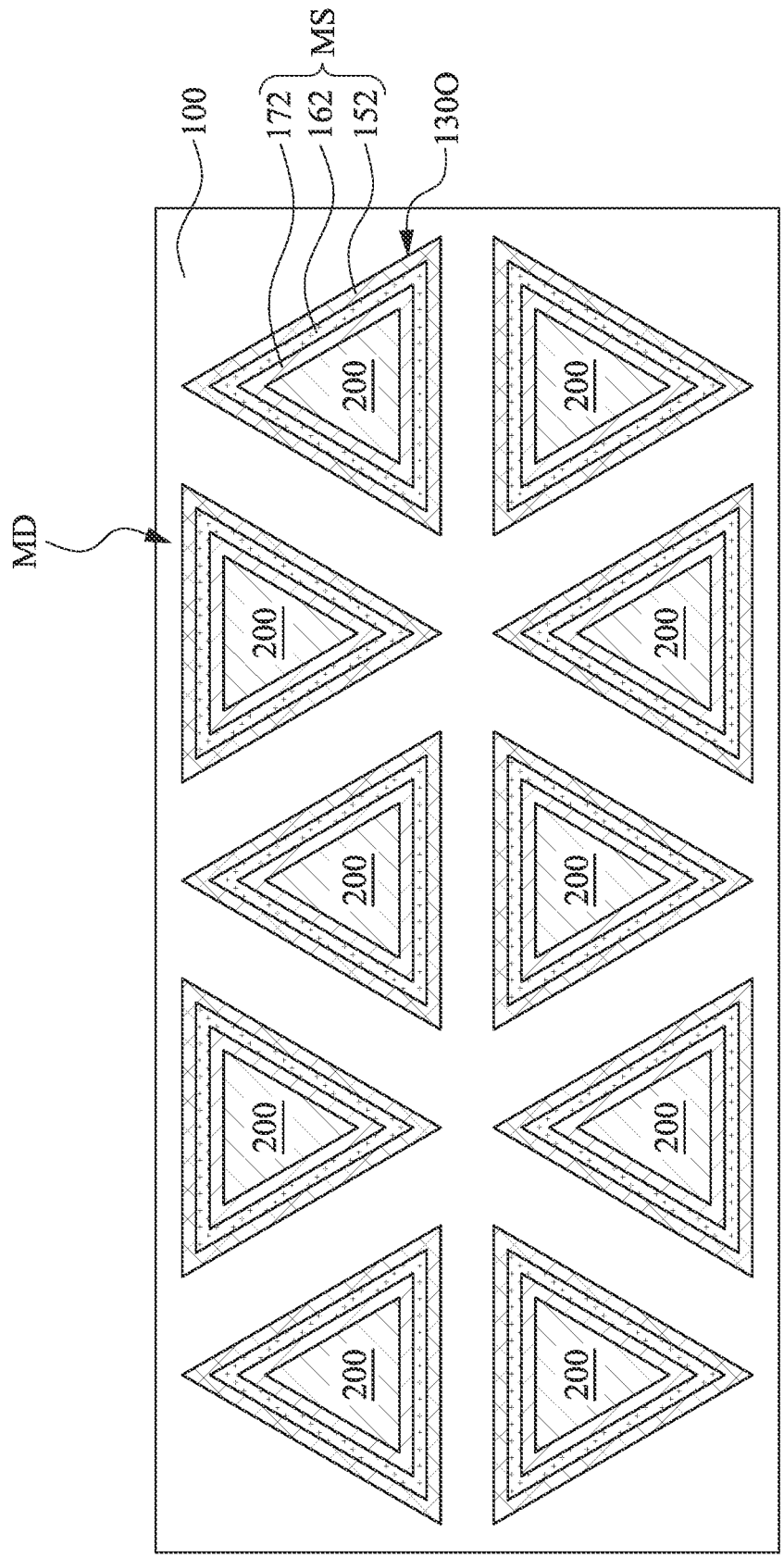
FIG. 25 is a schematic top view of an array of memory devices according to some embodiments of the present disclosure.

FIG. 25 is a schematic top view of an array of memory devices according to some embodiments of the present disclosure. The present embodiments are similar to the embodiments of FIG. 11A, and the differences between the present embodiments and the embodiments of FIG. 11A is at least that: the opening 130O in the ILD layer 130 (referring to FIG. 11B) has a triangular top view, and the memory structure MS in the opening 130O may have a triangular top surface. Other details of the present embodiments are similar to those of the embodiments of FIG. 11A, and therefore not repeated herein.

Figure 26:
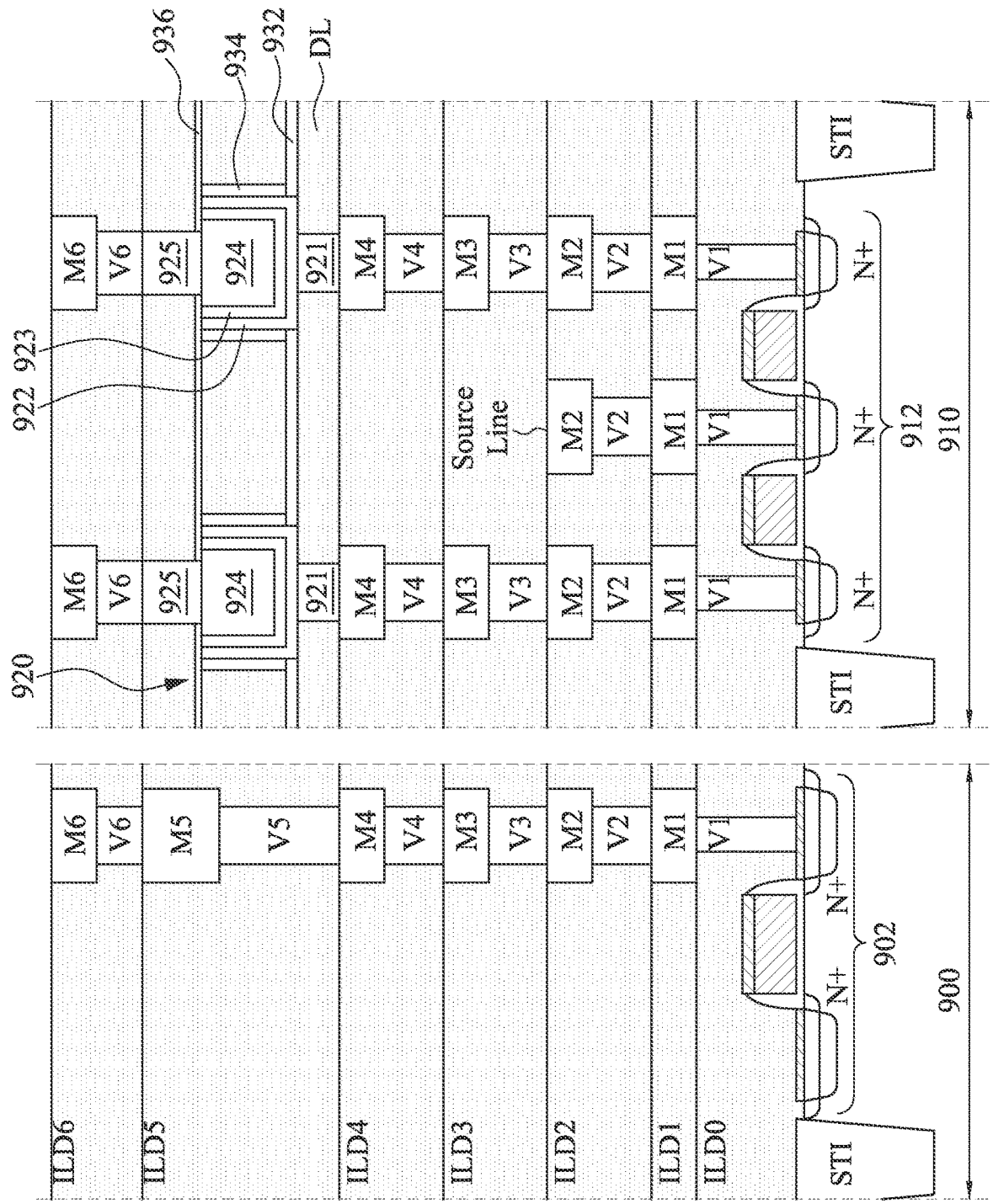
FIG. 26 illustrates an integrated circuit including memory devices and logic devices.

FIG. 26 illustrates an integrated circuit in accordance with some embodiments. The integrated circuit includes a logic region 900 and a memory region 910. The logic region 900 may include circuitry, such as an exemplary logic transistor 902, for processing information received from memory cells 920 in the memory region 910 and for controlling reading and writing functions of memory cells 920. In some embodiments, the memory cell 920 may include a bottom electrode via, 921, a bottom electrode 922, a resistance switching element 923, a top electrode 924, and a top electrode via 925. The bottom electrode via 921 is in a dielectric layer DL. The bottom electrode 922 is connected to the bottom electrode via 921 and surrounds the resistance switching element 923 and the top electrode 924. Spacer layer 932 and spacers 934 are around sidewalls of the bottom electrode 922. The resistance switching element 923 is sandwiched in between the bottom and top electrodes 922 and 924. The passivation layer 936 are covers top surfaces of the resistance switching element 923 and the bottom electrode 922. The top electrode vias 925 are connected to the top electrodes 924 through the passivation layer 936.

As depicted, an exemplary integrated circuit is fabricated using six metallization layers, labeled as M1 through M6, with six layers of metallization vias or interconnects, labeled as V1 through V6. Other embodiments may contain more or fewer metallization layers and a corresponding more or fewer number of vias. Logic region 900 includes a full metallization stack, including a portion of each of metallization layers M1-M6 connected by interconnects V2-V6, with V1 connecting the stack to a source/drain contact of the logic transistor 902. The memory region 910 includes a full metallization stack connecting the memory cells 920 to transistors 912 in the memory region 910, and a partial metallization stack connecting a source line to the transistors 912 in the memory region 910. The memory cells 920 are depicted as being fabricated in between the M4 layer and the M6 layer. Also included in integrated circuit is a plurality of ILD layers, identified as ILD0 through ILD6 are depicted in FIG. 26 as spanning the logic region 900 and the memory region 910. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the memory stack, including bottom and top electrodes and a resistance switching element therebetween, is formed by depositing and planarizing process, without an etching process, therefore the memory stack is formed free of etching damage, such as edge damage. Another advantage is that the memory stack is formed with vertical and horizontal effective memory interfaces (e.g., the interface between the bottom electrode and the resistance switching element and the interface between the top electrode and the resistance switching element), such that the effective area of the memory device is increased.

In some embodiments, a memory device includes a bottom electrode, a resistance switching element over the bottom electrode, a top electrode over the resistance switching element, and a dielectric layer. The dielectric layer surrounds the bottom electrode, the resistance switching element, and the top electrode. The resistance switching element has a first portion between the top electrode and the dielectric layer.

In some embodiments, a memory device includes a bottom electrode, a resistance switching element over the bottom electrode, a top electrode over the resistance switching element, a top electrode via connected to the top electrode; and a passivation layer. The passivation layer surrounds the top electrode via and covers a top surface of the bottom electrode and a top surface of the resistance switching element.

In some embodiments, an integrated circuit device includes a substrate, an interconnect layer over the substrate, a memory structure, and a second conductive feature. The interconnect layer comprises an interlayer dielectric layer and a first conductive feature surrounded by the interlayer dielectric layer. The memory structure is over the first conductive feature. The memory structure comprises: a bottom electrode over the first conductive feature; a resistance switching element over the bottom electrode; and a top electrode over the resistance switching element. The resistance switching element has a portion extending beyond edges of the top electrode, and the portion of the resistance switching element forms a closed loop from a top view. The second conductive feature is over the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a bottom electrode;
   a resistance switching element over the bottom electrode;
   a top electrode over the resistance switching element; and
   a dielectric layer surrounding the bottom electrode, the resistance switching element, and the top electrode, wherein the resistance switching element has a first portion between the top electrode and the dielectric layer, and a top surface of the dielectric layer is free from coverage by the bottom electrode.

2. The memory device of claim 1, wherein the resistance switching element has a second portion extending from the first portion of the resistance switching element and directly below the top electrode.

3. The memory device of claim 1, wherein the first portion of the resistance switching element is free from coverage of the top electrode.

4. The memory device of claim 1, wherein the bottom electrode has a portion between the first portion of the resistance switching element and the dielectric layer.

5. The memory device of claim 4, wherein the portion of the bottom electrode is free from coverage of the top electrode.

6. The memory device of claim 4, wherein a top surface of the portion of the bottom electrode is higher than a bottom surface of the top electrode.

7. A memory device, comprising:
   a bottom electrode;
   a resistance switching element over the bottom electrode;
   a top electrode over the resistance switching element;
   a dielectric layer surrounding the bottom electrode and the resistance switching element;
   a spacer layer spacing the bottom electrode from the dielectric layer;
   a top electrode via connected to the top electrode; and
   a passivation layer surrounding the top electrode via and covering a top surface of the bottom electrode and a top surface of the resistance switching element.

8. The memory device of claim 7, wherein the passivation layer is in contact with the top surface of the resistance switching element.

9. The memory device of claim 7, wherein the passivation layer is in contact with a top surface of the top electrode.

10. The memory device of claim 7, wherein a top surface of the top electrode via is higher than a top surface of the passivation layer.

11. The memory device of claim 7, wherein the top electrode via is spaced apart from the resistance switching element.

12. The memory device of claim 7, wherein the passivation layer is in contact with a top surface of the dielectric layer.

13. The memory device of claim 7, wherein the passivation layer is in contact with a top end of the spacer layer.

14. An integrated circuit device, comprising:
    a substrate;
    an interconnect layer over the substrate, wherein the interconnect layer comprises an interlayer dielectric layer and a first conductive feature surrounded by the interlayer dielectric layer;
    a memory structure over the first conductive feature, wherein the memory structure comprises:
        a bottom electrode over the first conductive feature;
        a resistance switching element over the bottom electrode; and
        a top electrode over the resistance switching element, wherein the resistance switching element has a portion extending beyond edges of the top electrode, and the portion of the resistance switching element forms a closed loop from a top view; and
    a second conductive feature over the top electrode.

15. The integrated circuit device of claim 14, wherein the bottom electrode has a portion extending beyond edges of the resistance switching element, and the portion of the bottom electrode forms a closed loop from the top view.

16. The integrated circuit device of claim 15, further comprising:
    a passivation layer over and in contact with the portion of the resistance switching element and the portion of the bottom electrode.

17. The integrated circuit device of claim 16, wherein the passivation layer is in contact with the second conductive feature.

18. The integrated circuit device of claim 14, wherein the bottom electrode is in contact with the first conductive feature.

19. The integrated circuit device of claim 14, wherein a width of the second conductive feature is less than a width of the first conductive feature.

20. The integrated circuit device of claim 14, wherein a top surface of the top electrode is substantially level with a top end of the portion of the resistance switching element.

\* \* \* \* \*